(12) United States Patent  
Iwaki

(10) Patent No.: US 9,019,138 B2  
(45) Date of Patent: Apr. 28, 2015

(54) COLUMN A/D CONVERTER, COLUMN A/D CONVERSION METHOD, SOLID-STATE IMAGING ELEMENT AND CAMERA SYSTEM

(75) Inventor: Hiroyuki Iwaki, Kanagawa (JP)

(73) Assignee: Sony Corporation, Tokyo (JP)

(*) Notice: Subject to any disclaimer, the term of this patent is extended or adjusted under 35 U.S.C. 154(b) by 212 days.

(21) Appl. No.: 13/637,870

(22) PCT Filed: Apr. 22, 2011

(86) PCT No.: PCT/JP2011/002359  
§ 371 (c)(1),  
(2), (4) Date: Sep. 27, 2012

(87) PCT Pub. No.: WO2011/135814  
PCT Pub. Date: Nov. 3, 2011

(65) Prior Publication Data  
US 2013/0015329 A1 Jan. 17, 2013

(30) Foreign Application Priority Data

Apr. 30, 2010 (JP) .................. 2010-105795

(51) Int. Cl.
| | |
|---|---|
| H04N 5/378 | (2011.01) |
| H03M 1/56 | (2006.01) |
| H03M 1/08 | (2006.01) |
| H04N 5/376 | (2011.01) |

(52) U.S. Cl.  
CPC ............. *H04N 5/378* (2013.01); *H03M 1/56* (2013.01); *H03M 1/0872* (2013.01); *H04N 5/3765* (2013.01)

(58) Field of Classification Search  
USPC .......... 341/156, 169, 165, 164; 348/248, 294; 250/208 R  
See application file for complete search history.

(56) References Cited

U.S. PATENT DOCUMENTS

| | | | | |
|---|---|---|---|---|
| 7,629,913 | B2 * | 12/2009 | Okumura | 341/156 |
| 2009/0026352 | A1 * | 1/2009 | Shimomura et al. | 250/214 R |
| 2012/0249850 | A1 * | 10/2012 | Hagihara | 341/156 |

FOREIGN PATENT DOCUMENTS

| | | |
|---|---|---|
| CN | 101304253 A | 11/2008 |
| JP | 2005-347931 A | 12/2005 |
| JP | 2009-033297 A | 2/2009 |
| JP | 2009-038726 A | 2/2009 |
| JP | 2009-038781 A | 2/2009 |
| JP | 2009-060327 A | 3/2009 |
| JP | 2009-124269 A | 6/2009 |

OTHER PUBLICATIONS

Japanese Office Action issued Jun. 10, 2014 for corresponding Japanese Application No. 2010-105795.

(Continued)

*Primary Examiner* — Howard Williams  
(74) *Attorney, Agent, or Firm* — Rader, Fishman & Grauer PLLC

(57) ABSTRACT

A solid-state imaging device having an analog-digital converter, and an analog-digital conversion method are described herein. An example of a solid-state imaging device includes a column processing section that includes a low-level bit latching section. The low-level bit latching section receives a comparator output from a comparator and a count output from a counter, and the low-level bit latching section latches a count value.

32 Claims, 23 Drawing Sheets

(56) References Cited

OTHER PUBLICATIONS

International Search Report; International Application No. PCT/JP2011/002359; Dated: May 17, 2011.

Yang, Woodward, et al., "An Intergrated 800x600 CMOS Imaging System" 1999 IEEE International Solid-State Circuits Conference, Digest of Technical Papers, ISSCC99 / Session 17/ Paper WA 17/.3, pp. 304, 305 and 471.

Chinese Office Action issued Dec. 24, 2014 for corresponding Chinese Application No. 201180020470.9.

\* cited by examiner

COLUMN A/D CONVERTER, COLUMN A/D CONVERSION METHOD, SOLID-STATE IMAGING ELEMENT AND CAMERA SYSTEM

TECHNICAL FIELD

The invention relates to a column A/D converter which is able be applied to a solid-state imaging element or the like of a CMOS image sensor or the like, a column A/D conversion method, a solid-state imaging element, and a camera system.

BACKGROUND ART

A CMOS image sensor is proposed which has a pixel array section provided as a plurality of pixels in a two dimensional alignment, sequentially reads out a pixel signal read from each pixel of the pixel array section for each of the pixel columns, performs CDS processing and the like on each column signal, and converts and outputs the image signals.

A column parallel output type of the CMOS image sensor, which has an FD amplifier having a floating diffusion (FD) layer for each pixel and in which the output thereof is performed by selecting one row from among the pixel arrays and reading out the selected row simultaneously in the column direction, is predominant.

This is because parallel processing is advantageous since it is difficult to obtain sufficient driving capacity in an FD amplifier arranged in the pixel and accordingly it is necessary to lower the data rate.

In regard to the pixel signal read out (output) circuit of the column parallel output type CMOS image sensor, in fact, various versions have been proposed.

One version which is the most advanced is a type where an analog-digital converter (abbreviated as ADC below) is provided for each column and a pixel signal is output as a digital signal.

A CMOS image sensor mounted with such a column parallel type ADC is, for example, disclosed by JP-A-2005-278135 and W. Yang et. al., "An Integrated 800×600 CMOS ImageSystem," ISSC Digest of Technical Papers, pp. 304-305, February, 1999.

FIG. 1 is a block diagram illustrating a configuration example of a solid-state imaging element mounted with a column parallel ADC (CMOS image sensor).

As shown in FIG. 1, a solid-state imaging element 1 has a pixel section 2, a vertical scanning circuit 3, a horizontal transfer scanning circuit 4, and a column processing circuit group 5 formed from a group of ADCs.

In addition, the solid-state imaging element 1 has a digital-analog converter (abbreviated as DAC below) 6 and an amplifier circuit (S/A) 7.

The pixel section 2 is configured by a unit pixel 21, which includes a photo diode (photoelectric conversion element) and an inner-pixel amplifier, being arranged in a matrix shape (column-row shape).

In the column processing circuit group 5, a plurality of column processing circuits 51, which forms an ADC for each column, is column parallel.

Each of the column processing circuits (ADC) 51 has a comparator 51-1 which compares a reference signal RAMP (Vslop), which is a ramp waveform (RAMP) which changes a reference signal generated using a DAC6 into a stepwise shape, and an analog signal, which is obtained from pixels for each row via a vertical signal line.

Furthermore, each of the column processing circuits 51 counts the comparison time of the comparator 51-1 and has a counter latch 51-2 which holds the count result.

The column processing circuits 51 have an n bit digital signal conversion function and are arranged for each vertical signal line (column line) 8-1 to 8-n so as to configure a column parallel ADC block.

The output of each of a memory 51-2 is connected to, for example, a horizontal transfer line 9 with a k bit width.

In addition, k amplifier circuits 7 are arranged corresponding to the horizontal transfer lines 9.

FIG. 2 is a diagram illustrating a timing chart of a circuit of FIG. 1.

In each of the column processing circuits (ADC) 51, the analog signals (potential Vsl) read out from the vertical signal line 8 are compared by the comparator 51-1 arranged for each column to, for example, the reference signal RAMP (Vslop) changing into a stepwise shape.

At this time, the levels of the analog potential Vsl and the reference signal RAMP (Vslop) cross, and counting is performed by the counter latch 51-2 using a standard clock CK until the output of the comparator 51-1 is reversed. According to this, the potential (analog signal) Vsl of the vertical signal line 8 is converted to a digital signal (AD converted). At this time, the counter is configured as a down bit ripple counter.

The AD conversion is performed twice for one read out.

In the first time, the reset levels (P-phase) of the unit pixels 21 are read out to the vertical signal lines 8 (−1 to −n) and AD conversion is performed.

Variation is included in the reset level P-phase of each pixel.

In the second time, signals photoelectrically converted by each of the unit pixels 21 are read out (D-phase) to the vertical signal lines 8 (−1 to −n) and AD conversion is performed.

Since there is also variation in the D-phase of each pixel, by performing (D-phase level-P-phase level), it is possible to realize correlated double sampling (CDS).

A signal converted to a digital signal is recorded in the counter latch 51-2, is read out in order to the amplifier circuit 7 via the horizontal transfer line 9 by the horizontal (column) transfer scanning circuit 4 in order, and is finally output.

In this manner, the column parallel output processing is performed.

As described above, in a solid-state imaging element of a voltage slope method which performs general column parallel read out, the standard clock CK which decides AD resolution is input to a ripple counter arranged for all of the column lines, and a count operation is performed for each column.

As a result, if clock frequency increases and the number of horizontal columns becomes large, power consumed by the counter of each column increases, and if the product characteristics deteriorate, there are adverse effects such as a fall in operation margins due to IR drop and the like at the same time.

Additionally, due to a large burden on a standard clock line, degrading of clock duty becomes larger as the standard clock becomes faster and there is a limit on AD resolution.

It is desirable to provide a column A/D converter, a column A/D conversion method, a solid-state imaging element, and a camera system that are capable of significantly reducing power consumption.

SUMMARY OF INVENTION

A solid-state imaging device having an analog-digital converter, and an analog-digital conversion method are described herein.

An example of a solid-state imaging device includes a column processing section that includes a low-level bit latching section. The low-level bit latching section receives a comparator output from a comparator and a count output from a counter, and the low-level bit latching section latches a count value.

Another example of a solid-state imaging device includes a counter and a plurality of column processing sections. Each of the column processing sections includes a comparator and a low-level bit latching section. And within each of the column processing section, the low-level bit latching section receives a comparator output from the comparator and a count output from the counter, and the low-level bit latching section latches a count value.

An example of an analog-digital conversion method includes outputting a comparator output to a low-level bit latching section, outputting a count output to the low-level bit latching section, and latching a count value with the low-level bit latching section.

Another example of an analog-digital conversion method includes outputting comparator outputs to a plurality of low-level bit latching sections, outputting a count output to the low-level bit latching sections, and latching count values with the low-level bit latching sections.

DESCRIPTION OF EMBODIMENTS

Below, embodiments of the invention will be associated with the drawings and described.

1. Example of Overall Configuration of Solid-State Imaging Element

Figure 1:
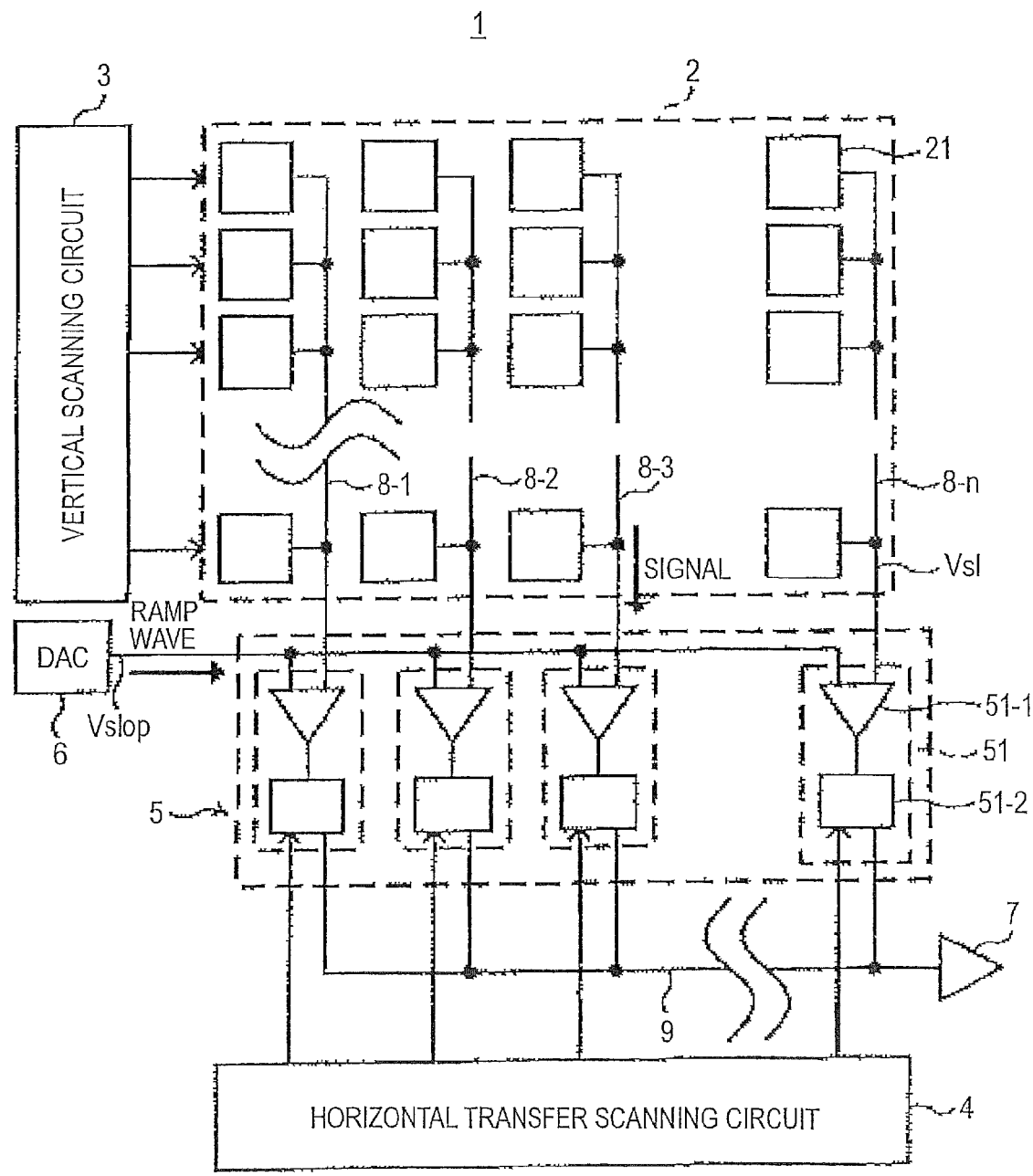
FIG. 1 is a block diagram illustrating a configuration example of a solid-state imaging element mounted with a column parallel ADC (CMOS image sensor).
Figure 2:
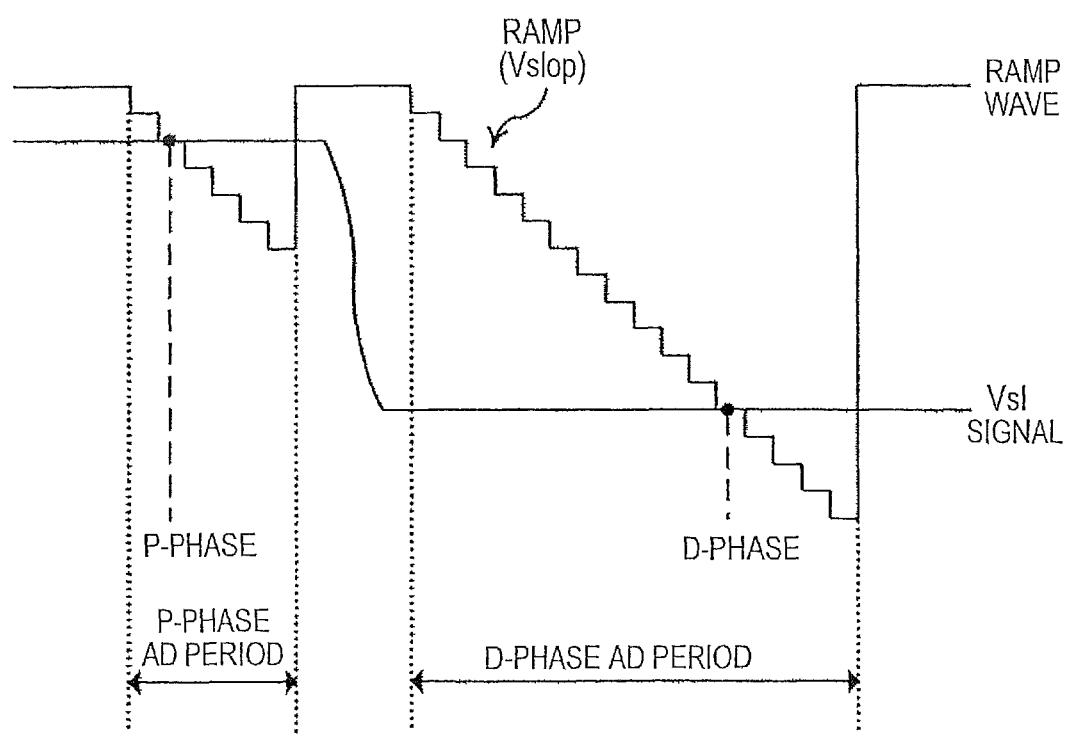
FIG. 2 is a diagram illustrating a timing chart of a circuit of FIG. 1.
Figure 3:
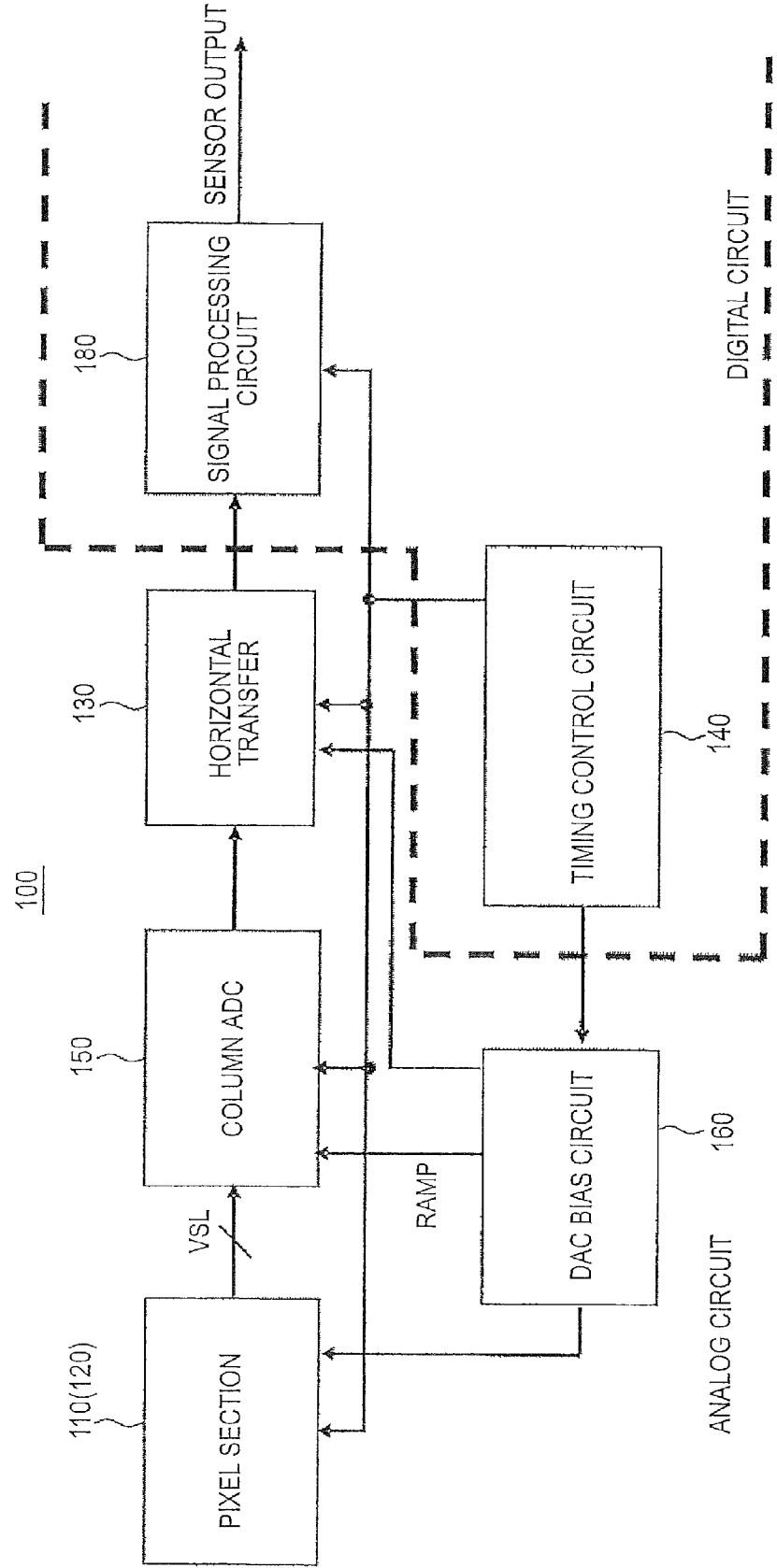
FIG. 3 is a block diagram illustrating a configuration example of a solid-state imaging element mounted with a column parallel ADC (CMOS image sensor) according to an embodiment of the invention.

FIG. 3 is a block diagram illustrating a configuration example of a solid-state imaging element mounted with a column parallel ADC (CMOS image sensor) according to an embodiment of the invention.

Figure 4:
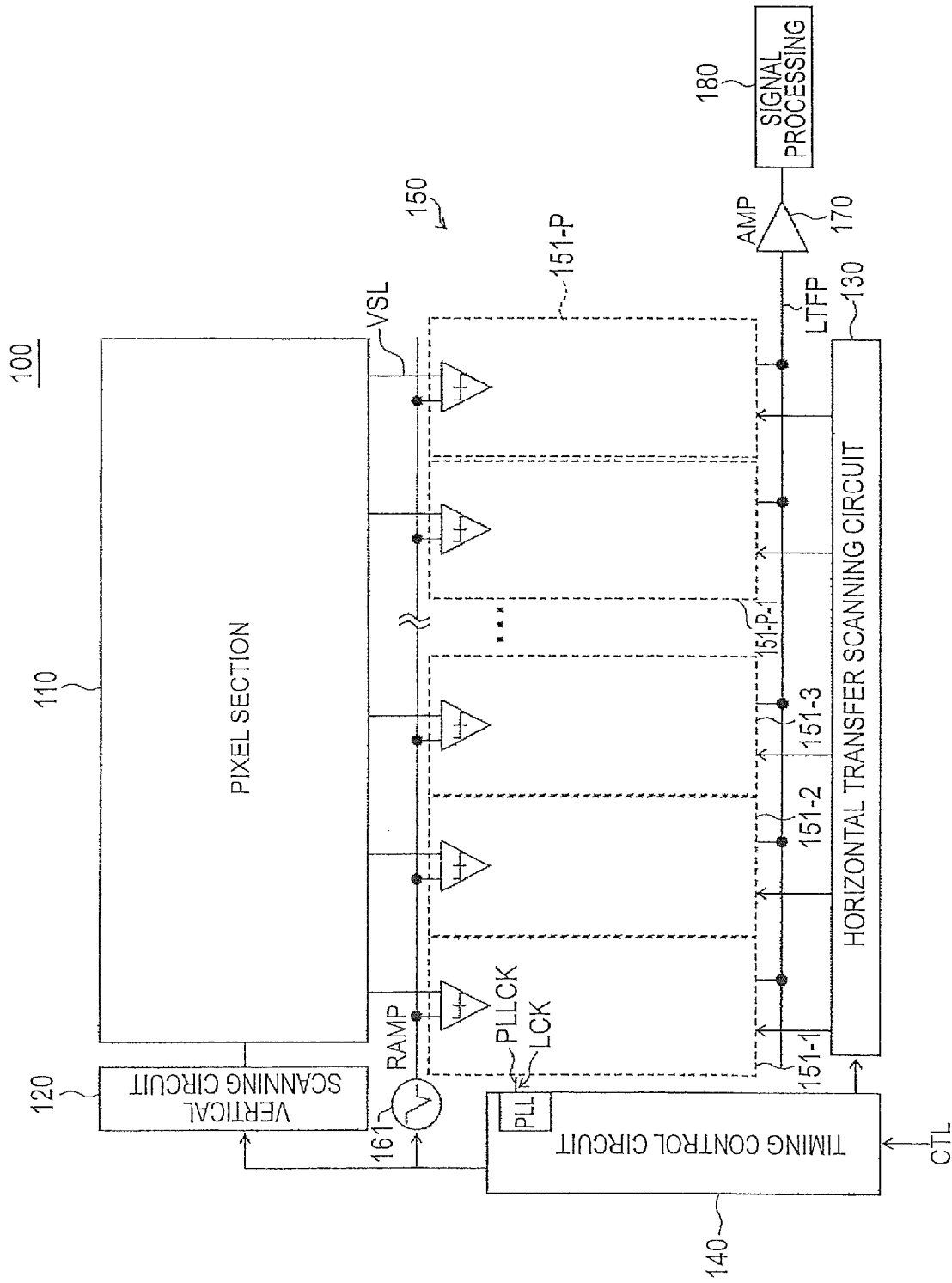
FIG. 4 is a block diagram illustrating in more detail an ADC group of the solid-state imaging element mounted with a column parallel ADC (CMOS image sensor) shown in FIG. 3.

FIG. 4 is a block diagram illustrating in more detail the main sections of the solid-state imaging element mounted with a column parallel ADC (CMOS image sensor) shown in FIG. 3.

As shown in FIGS. 3 and 4, a solid-state imaging element 100 has a pixel section 110 which is an imaging section, a vertical scanning circuit 120, a horizontal transfer scanning circuit 130, a timing control circuit 140, and a column A/D converter (ADC) 150 which is a pixel signal read out section. In addition, the pixel signal read out section is configured including the vertical scanning circuit 120 and the like.

The solid-state imaging element 100 has a DAC and bias circuit 160 including a D/A converter 161, an amplifier circuit (S/A) 170 and a signal processing circuit 180.

Out of these constituent elements, the pixel section 110, the vertical scanning circuit 120, the horizontal transfer scanning circuit 130, the column A/D converter 150, the DAC and bias circuit 160, and the amplifier circuit (S/A) 170 are configured by an analog circuit.

Also, the timing control circuit 140 and the signal processing circuit 180 are configured by a digital circuit.

As will be described later, the column ADC 150 of the embodiment is configured in the following manner since most power consumption in a normal column ADC is constituted by low-level side bits of ripple counters in each column.

The column ADC 150 adopts a configuration of latching for each column an output code of an N bit Gray code counter, of which one is arranged in a plurality of columns and which performs counting in synchronization with a standard clock PLLCK, without performing a count operation of low-level side bits of each column. According to this, an AD conversion value is set.

In the column ADC 150 of the embodiment, the standard clock PLLCK which is generated by a PLL circuit of the timing control circuit 140 is input only to a number of units of the Gray code counters.

As a result, it is possible to reduce the load on the wirings and increase the operating frequency.

Also, in the column ADC 150 of the embodiment, since a count operation of low-level bits is not performed for each column, it is possible to suppress power consumption to be small.

In the column ADC 150, in regard to the counter high-level side bits, it is possible to perform a ripple count operation using the code (clock) of the counter output $N^{th}$ bit.

According to this, it is possible to perform digital CDS (Correlated Double Sampling) in columns and it is also possible to suppress the area of the horizontal transfer wiring.

Also, it is possible for the column ADC 150 to take a configuration where so-called vertical (V) direction calculation is performed in columns even in regard to latched low-level bits by arranging a calculator and the like in columns.

It is possible for the column ADC 150 of the embodiment to compare with a full bit ripple counter method in a case with simultaneous temporal resolution and to suppress power consumption to approximately ⅛.

In the pixel section 110, a plurality of unit pixels 110A including a photodiode (photoelectric conversion element) and an inner-pixel amplifier is arranged in two-dimensional m rows and n columns (matrix shape).

Configuration Example of Unit Pixels

Figure 5:
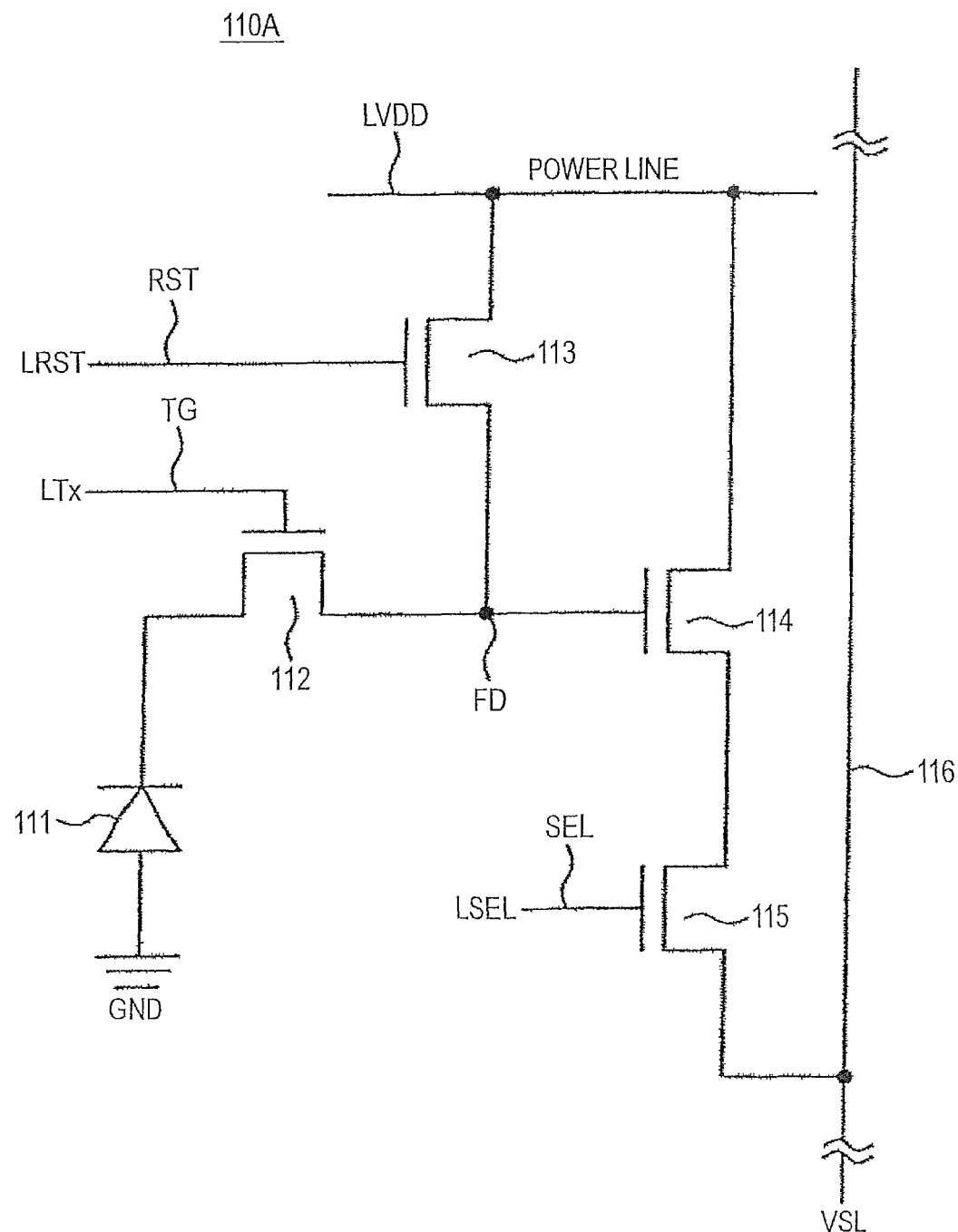
FIG. 5 is a diagram illustrating an example of a pixel of a CMOS image sensor configured by four transistors according to an embodiment.

FIG. 5 is a diagram illustrating an example of a pixel of a CMOS image sensor configured by four transistors according to the embodiment.

The unit pixel 110A has a photodiode 111 which is, for example, a photoelectric conversion element.

In regard to one photodiode 111, the unit pixel 110A has four transistors, a transfer transistor 112 which is a transfer element, a reset transistor 113 which is a reset element, an amplification transistor 114 and a selection transistor 115, which are active elements.

The photodiode 111 photo-converts incident light to an amount of charge (here, electrons) corresponding to the amount of light.

The transfer transistor 112 connects between the photodiode 111 and a floating diffusion FD which is an output node.

The transfer transistor 112 transfers electrons photo-converted by the photodiode 111 which is a photoelectric conversion element to the floating diffusion PD by applying a driving signal TG to a gate thereof (transfer gate) via a transfer control line LTx.

The reset transistor 113 connects between a voltage source line LVDD and the floating diffusion FD.

The reset transistor 113 resets the potential of the floating diffusion FD to the potential of the voltage source line LVDD by applying a reset RST to the gate thereof via a reset control line LRST.

The floating diffusion FD is connected to a gate of the amplification transistor 114. The amplification transistor 114 is connected to a vertical signal line 116 via the selection transistor 115 and configures a source follower with a constant current source outside the pixel section.

Then, via a selection control line LSEL, a control signal (address signal or select signal) SEL is applied to a gate of the selection transistor 115 and the selection transistor 115 is turned on.

When the selection transistor 115 is turned on, the amplification transistor 114 amplifies the potential of the floating diffusion FD and outputs a voltage corresponding to the potential to the vertical signal line 116. Via the vertical signal line 116, the voltage output from each pixel is output to the column ADC 150 which is a pixel signal read out section.

These operations are performed simultaneously in parallel in regard to one row of each pixel since, for example, each gate of the transfer transistor 112, the reset transistor 113 and the selection transistor 115 is connected in row units.

The reset control line LRST, the transfer control line LTx and the selection control line LSEL, which wire the pixel section 110, are wired as a group for each row unit of the pixel arrangement.

The reset control line LRST, the transfer control line LTx and the selection control line LSEL are driven by the vertical scanning circuit 120 which is a pixel driving section.

In the solid-state imaging element 100, the timing control circuit 140, which generates an internal clock as a control circuit for sequentially reading out a signal of the pixel section 110, the vertical scanning circuit 120, which controls row address and row scanning, and the horizontal transfer scanning circuit 130, which controls column address and column scanning, are arranged.

The timing control circuit 140 generates a timing signal which is necessary for signal processing of the pixel section 110, the vertical scanning circuit 120, the horizontal transfer scanning circuit 130, the column ADC 150, the DAC and bias circuit 160, and the signal processing circuit 180.

Also, the timing control circuit 140 includes a PLL circuit 141.

The PLL circuit is used in the count operation of the column ADC 150, for example, the standard clock PLLCK with a frequency of 900 MHz is generated and supplied via a clock supply line LCK to the Gray code counter of which one is arranged for a plurality of columns of the column ADC 150.

In the pixel section 110, an image or a screen image is photo-converted for each pixel row due to photon accumulation and discharge using a line shutter, and an analog signal VSL is output to the column ADC 1501 which is a column processing circuit group.

In the column ADC 150, in each of the column sections, AD conversion, which uses a reference signal (ramp signal) RAMP from a DAC 161, of a analog output from the pixel section 110 and digital CDS are performed, and a digital signal of a number of bits is output.

In the horizontal transfer scanning circuit 130, simultaneous parallel transfer of a number of channels is performed to ensure transfer speed.

In the later stage signal processing circuit 180, correction of vertical line defects and point defects and signal clamp processing are performed, or digital signal processing such as parallel-serial conversion, compression, encoding, calculation, averaging, and intermittent operations.

In the solid-state imaging element 100 of the embodiment, the digital output of the signal processing circuit 180 is sent as the input for base band LSI or ISP.

Below, the function and configuration of the column ADC 150 which has the characteristic configuration according to the embodiment will be described in detail.

2. Basic Configuration Example of Column ADC

Figure 6:
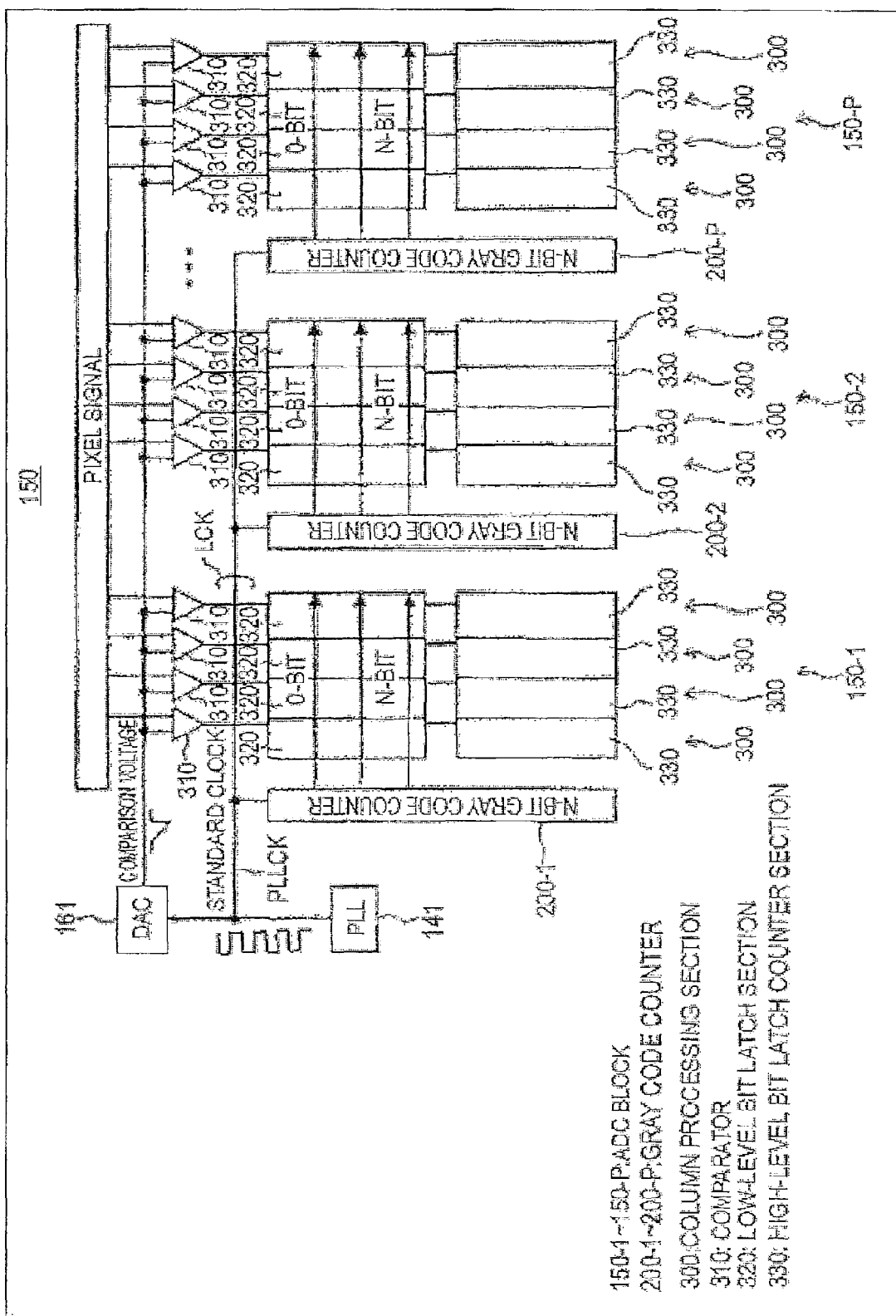
FIG. 6 is a first diagram illustrating a basic configuration example of an A/D converter according to an embodiment.
Figure 7:
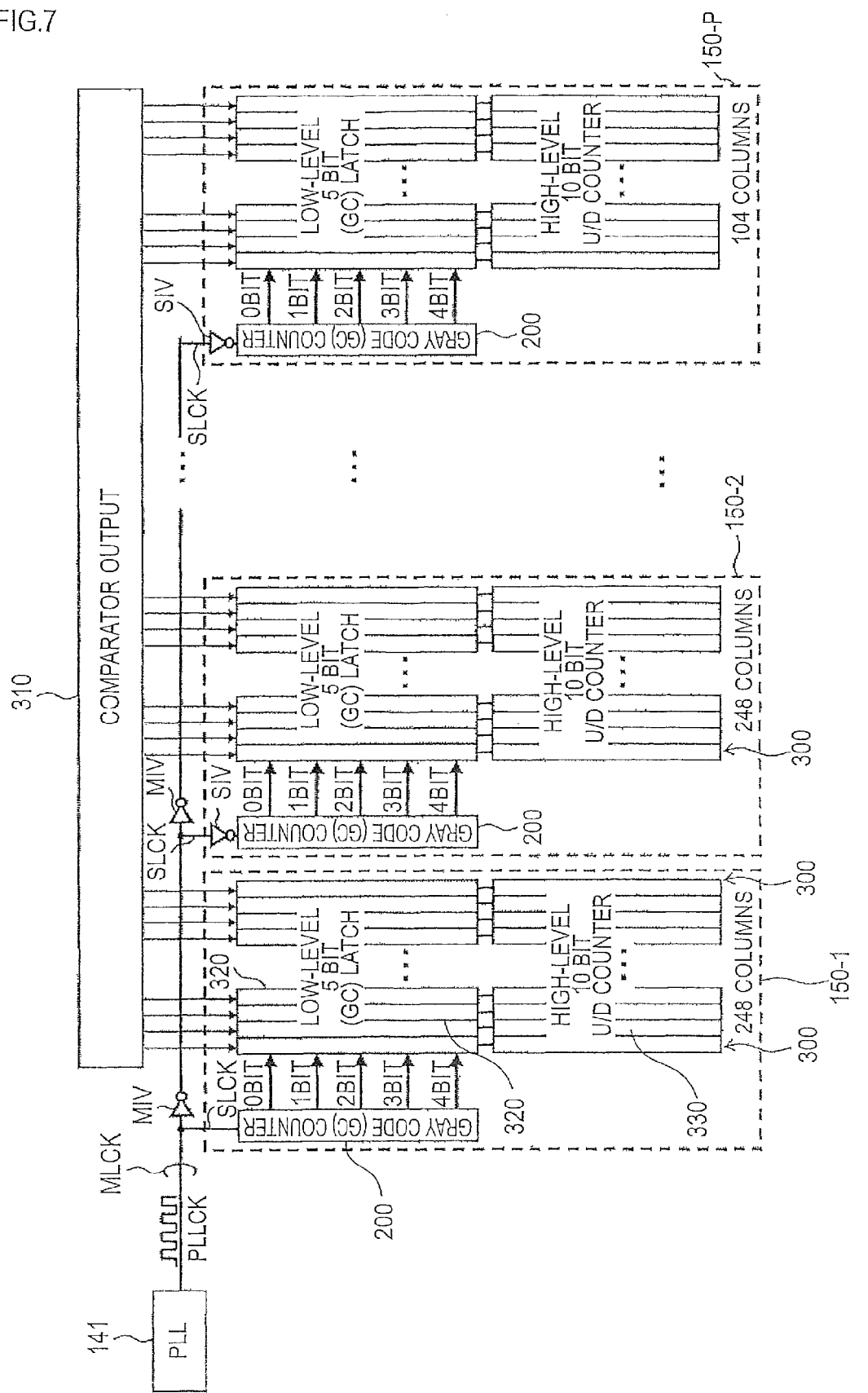
FIG. 7 is a second diagram illustrating a basic configuration example of an A/D converter according to an embodiment.

FIGS. 6 and 7 are diagrams illustrating a basic configuration example of the column A/D converter (column ADC) 150 according to the embodiment.

The column ADC 150 according to the embodiment is configured as a low-level N bit and high-level M bit ADC.

The column ADC 150 according to the embodiment is configured as, for example, a low-level 5 bit and high-level 10 bit ADC.

The column ADC 150 has a plurality of ADC blocks 151-0 to 151-P including a plurality of columns. In other words, the column ADC 150 is divided into a plurality of ADC blocks which have a plurality of columns as one ADC block.

In the column ADC 150, one Gray code counter 200-1 to 200-P is arranged in each ADC block 150-1 to 150-P. The Gray code counters 200-1 to 200-P function as code conversion counters.

In each column, a column processing section 300 is arranged which performs comparison processing, low-level bit latching and high-level bit counting operations for each column.

The column processing section 300 has a comparator (comparator) 310 which compares a reference signal RAMP (Vslop), which is a ramp waveform (RAMP) which changes an inclination generated by the DAC 161, and an analog signal VSL, which is obtained from pixels for each row line via the vertical signal line 116.

The column processing section 300 has a low-level bit latch section 320 with low-level N bits which receives output from the comparator 310 and count results from the Gray code counters 200-1 to 200-P and latches a count value.

The column processing section 300 has a high-level bit counter section 330 with high-level M bits which receives latch output of the low-level bit latch circuit farthest to the high-level side of the low-level bit latch section 320 and performs a count operation.

Also, the column processing section 300 has a bit inconsistency prevention circuit 340 which prevents bit inconsistency between output of the low-level bit latch circuit farthest to the high-level side and high-level bit ripple counter circuit farthest to the low-level side of the high-level bit ripple counter 330.

In addition, a latch counter section is formed by the low-level bit latch section 320 and the high-level bit counter section 330.

Also, the first counter is formed by the Gray code counters 200 and the low-level bit latch section 320, and the second counter is formed by the high-level bit counter section 330.

In the embodiment, the reference signal RAMP is generated as a ramp waveform where a voltage value changes linearly with time, for example.

The comparator 310 of each column processing section 300 compares the reference signal RAMP and the analog signal VSL which is read out to the vertical signal line 116 from pixels of the pixel section 110 whose address is specified.

Here, the comparator 310 outputs an output signal VCO at a high level until the reference signal PAMP and the analog signal VSL match, and when matched, the level of the output signal VCO is reversed from a high level to a low level.

In the embodiment, a latch operation of Gray codes GC[0] to GC[4] of the low-level bit latch section 320 is performed with the reversing of the output level of the output signal VCO of the comparator 310 as a trigger.

3. Configuration Example of Gray Code Counter

Each of the Gray code counters 200 is generated by the PLL circuit 141 of the timing control circuit 140 and is propagated by the clock supply line LPLLCK, for example, the standard clock PLLCK with a frequency fn (MHz) is received and an N bit Gray code GC which is a digital code is generated.

A plurality of the N bit Gray codes GC are formed as code where level transition of 1 bit occurs only between a logical "1" and a logical "0".

The Gray code counters 200 of the embodiment receive the standard clock PLLCK with the frequency fn, perform the count operation, and generate 5 (=N) bit Gray codes GC[0] to GC[4] with divided frequencies.

The Gray code counters 200 generate a Gray code GC[0] with the lowest level frequency ($\frac{1}{2}$) fn, generate a Gray code GC[1] with the frequency ($\frac{1}{4}$) fn and generate a Gray code GC[2] with the frequency ($\frac{1}{8}$) fn MHz.

The Gray code counters 200 generate a Gray code GC[3] with the frequency ($\frac{1}{16}$) fn and generate a Gray code GC[4] with the highest level.

Each of the Gray code counters 200 supplies the generated Gray codes to the low-level bit latch section 320 for a plurality of columns included in the same ADC block 150-1 to 150-P.

The Gray code counters 200 generate binary codes PG[0] to PG[4] using a rising edge of the input standard clock PLLCK, and the input clock and the binary codes PG[0] to PG[4] are generated.

Then, synchronization of each bit is regained using a clock CK with the same frequency as the standard clock PLLCK and a reverse signal XCK, and the Gray codes GC[0] to GC[4] are output.

In addition, the Gray code counters 200 have a function of generating a carry mask signal CMASK used by the bit inconsistency prevention circuit 34. However, in regard to this function, description will be performed along with the bit inconsistency prevention circuit 34 described later.

Each of the Gray code counters 200 supplies the generated Gray codes to the low-level bit latch section 320 for a plurality of columns included in the same ADC block 150-1 to 150-P.

Transmission of Standard Clock PLLCK

In the embodiment, a configuration shown in FIG. 7 is adopted to prevent duty breakage of the standard clock PLLCK transmitted by the clock supply line LCK.

That is, in a main clock supply line MLCK wired for all columns from an output section of the PLL circuit 141, each one main inverter MIV by a single CMOS buffer is used as a repeater.

Then, in a sub clock supply line SLCK which branches off to the Gray code counters 200 of each ADC block 150-1 to 150-P, a sub inverter SW is selectively arranged as a reversing circuit so that the standard clock PLLCK is supplied by positive logic.

In the example of FIG. 7, since the Gray code counter 200-1 of the ADC block 150-1 does not go through the main inverter MIV which is a repeater, the sub inverter SIV is not arranged in the sub clock supply line SLCK.

Since the Gray code counter 200-2 of the ADC block 150-2 goes through the main inverter MW which is a repeater, the sub inverter SW is arranged in the sub clock supply line SLCK.

Below is configured in the same manner.

By adopting such a configuration, while preventing duty breakage of the standard clock PLLCK with a high speed of approximately the frequency fn (MHz), it is possible to maintain it at approximately 50% and transfer it to the Gray code counters 200 which are the supply destination.

4. Configuration Example of Low-level Bit Latch Section 320 and High-level Bit Ripple Counter 330

The low-level bit latch section 320 has a function latching the Gray codes GC[0] to GC[4] generated by the Gray code counters 200 of the same ADC block 150-1 to 150-P with the reversing of the output of the comparator 310 of the same column to a low level used as a trigger.

Figure 8:
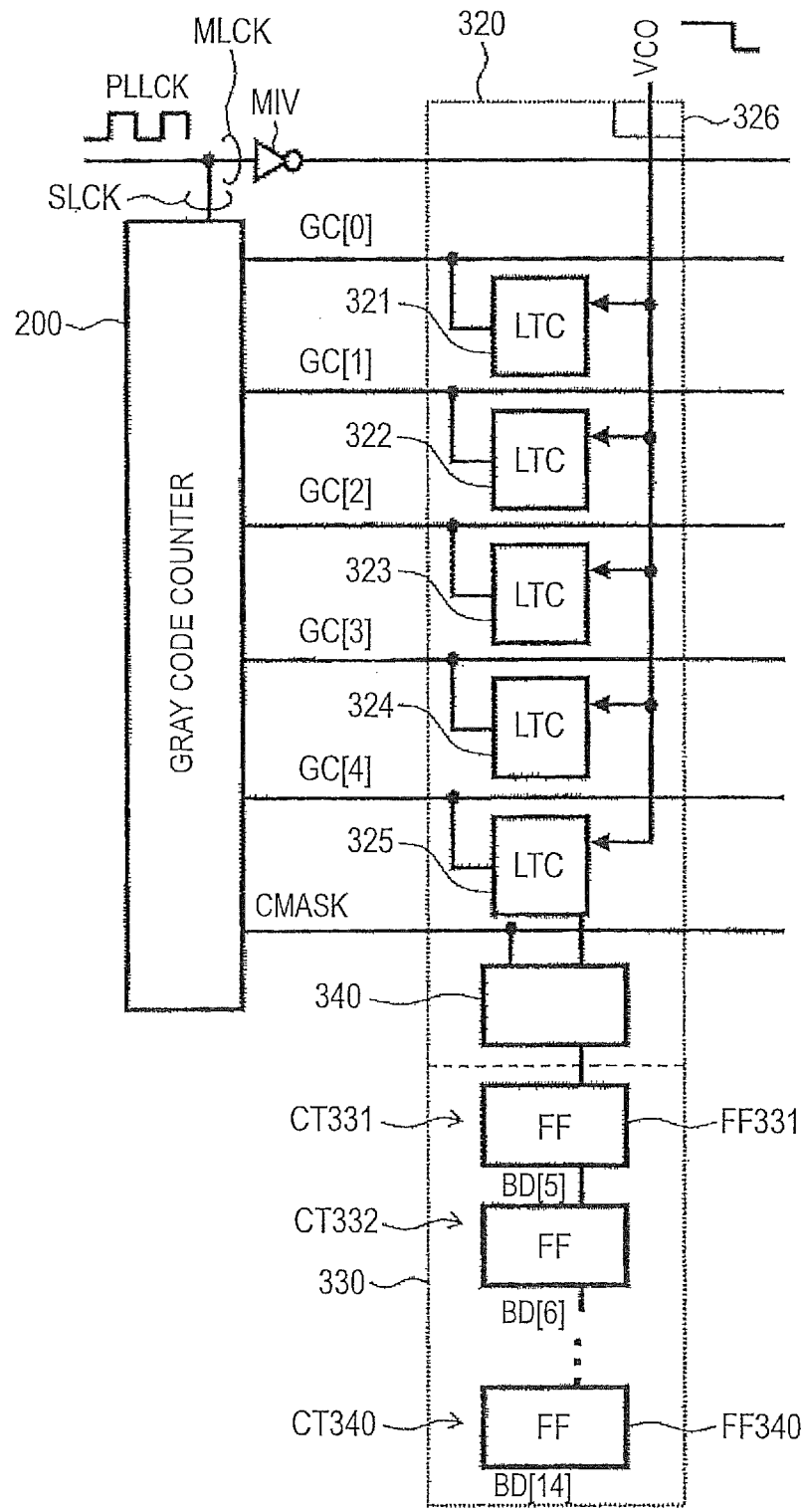
FIG. 8 is a diagram illustrating a basic arrangement relationship of output of a Gray code counter, a low-level bit latch section and a high-level bit ripple counter according to an embodiment.

FIG. 8 is a diagram illustrating a basic arrangement relationship of output of a Gray code counter, a low-level bit latch section and a high-level bit ripple counter according to the embodiment.

Figure 9:
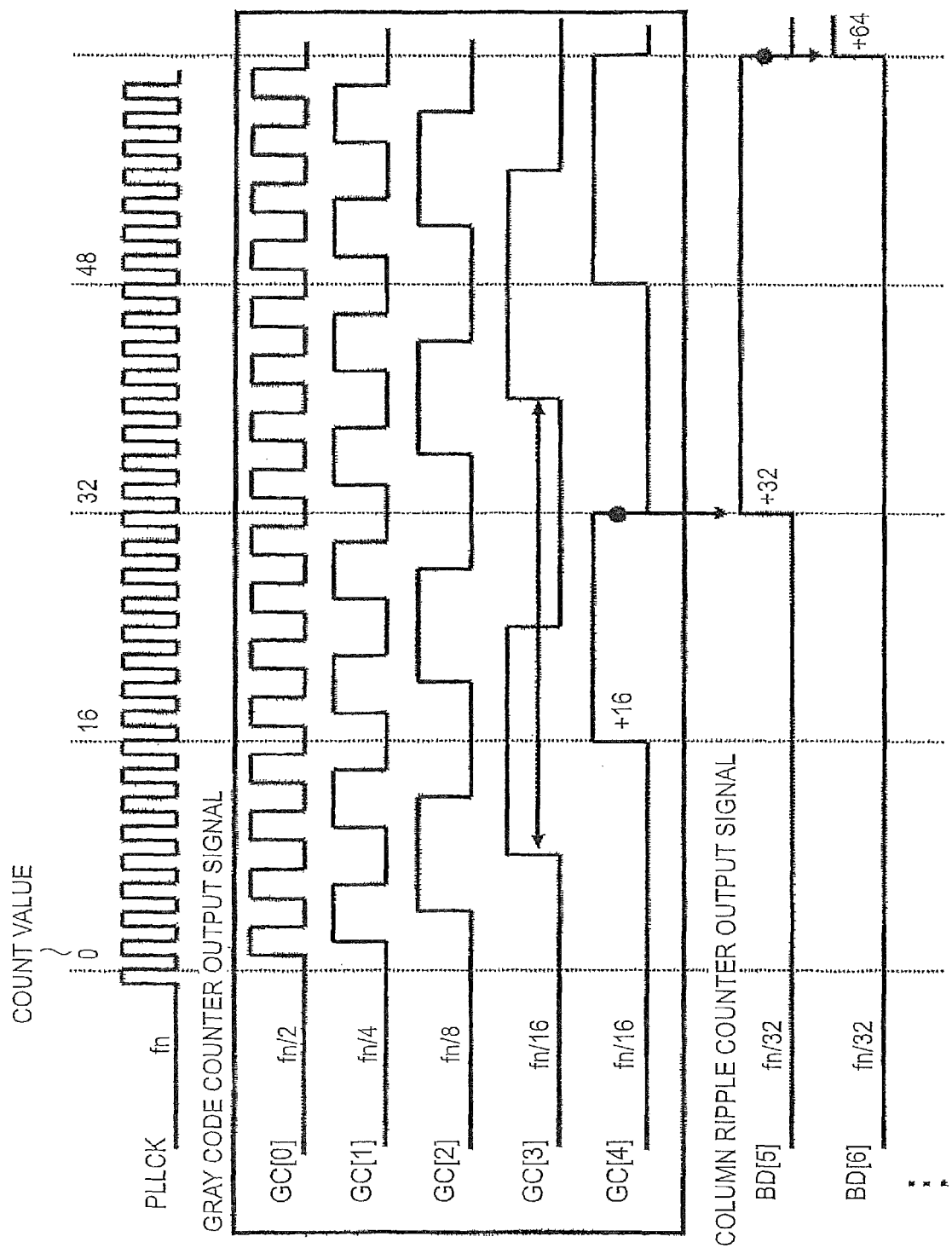
FIG. 9 is a diagram illustrating an example of Gray code latched in a low-level bit latch section and each counter output of high-level bit ripple counters according to an embodiment.

FIG. 9 is a diagram illustrating an example of Gray code latched in a low-level bit latch section and each counter output of high-level bit ripple counters according to the embodiment.

4.1 Configuration Example of Low-Level Bit Latch Section

The low-level bit latch section 320 arranged in each column has low-level bit latch circuits (LTC) 321 to 325 (32N) which latch each of the Gray codes GC[0] to GC[4], and a comparator output input section (VCO input section) 326 which inputs the output of the comparator 310.

The low-level bit latch circuit 321 fetches and latches the Gray code GC[0] by the Gray code counters 200.

The low-level bit latch circuit 322 fetches and latches the Gray code GC[1] by the Gray code counters 200.

The low-level bit latch circuit 323 fetches and latches the Gray code GC[2] by the Gray code counters 200.

The low-level bit latch circuit 324 fetches and latches the Gray code GC[3] by the Gray code counters 200.

The low-level bit latch circuit 325 fetches and latches the Gray code GC[4] by the Gray code counters 200.

Then, the output of the low-level bit latch circuit 325 which is farthest to the high-level side is supplied to a bit ripple counter CT331, which is farthest to the low-level side, of a high-level bit counter section 330 for high-level M bits through the bit inconsistency prevention circuit 34.

Also, the low-level bit latch circuits 321 to 325 have a function of transferring and outputting latch data when in P-phase for CDS to a data transfer line LTRF.

In this case, P-phase data processing is performed in the later stage signal processing circuit 180.

Driving by Delayed VCO

FIGS. 10A to 10C are diagrams for describing delayed VCO driving which is a preferred driving method for latch processing in a low-level bit latch section according to the embodiment.

FIG. 10A schematically shows a low-level bit latch section of one ADC block.

FIG. 10B shows a timing for normal VCO driving where the output signal VCO of the comparator 310 is not delayed.

FIG. 10C shows a timing for delayed VCO driving where the output signal VCO of the comparator 310 is delayed.

As shown in FIG. 10B, in a case of normal VCO driving where the output signal VCO of the comparator 310 is not delayed, since latching is at a timing of the falling edge of a signal VCO, power consumption is high as a latch node ND322 toggles until the data is set.

As shown in FIG. 10C, in a case of delayed VCO driving where the output signal VCO of the comparator 310 is delayed, latching is n seconds after a timing of the falling edge of a signal VCO. As a result, it is possible to suppress power consumption until the edge timing of the signal VCO since there is no toggling of the latch node ND322.

In the case of delayed VCO driving, for example, in the VCO input section 326, it is possible to arrange a delay element and configure so as to adjust by hand.

4.2 Configuration Example of High-level Bit Counter Section

The high-level bit counter section 330 is arranged on the output side of the low-level bit latch section 320 with such a configuration via the bit inconsistency prevention circuit 340 which prevents bit inconsistency.

The high-level bit counter section 330 is configured so that ripple counters (binary counters) CT331 to CT340 with M bits (M=10 in this example) are cascade connected.

The ripple counters CT331 to CT340 are formed as up-down (U/D) counters.

As shown in FIG. 9, the high-level bit counter section 330 is counted using the ripple counter CT331 which is farthest to the low-level side at a timing of a falling edge of the Gray code GC[N(=4)] which is latched in the low-level bit latch circuit 325 which is farthest to the high-level side of the low-level bit latch section 320.

Next, the later stage ripple counter CT332 is counted at a timing of a falling edge of the earlier stage ripple counter CT331.

Below, in the same manner, the count operation is performed at a timing of the falling edge of output signals of the earlier stage ripple counters.

Specific Configuration Example of Ripple Counter

Figure 10:
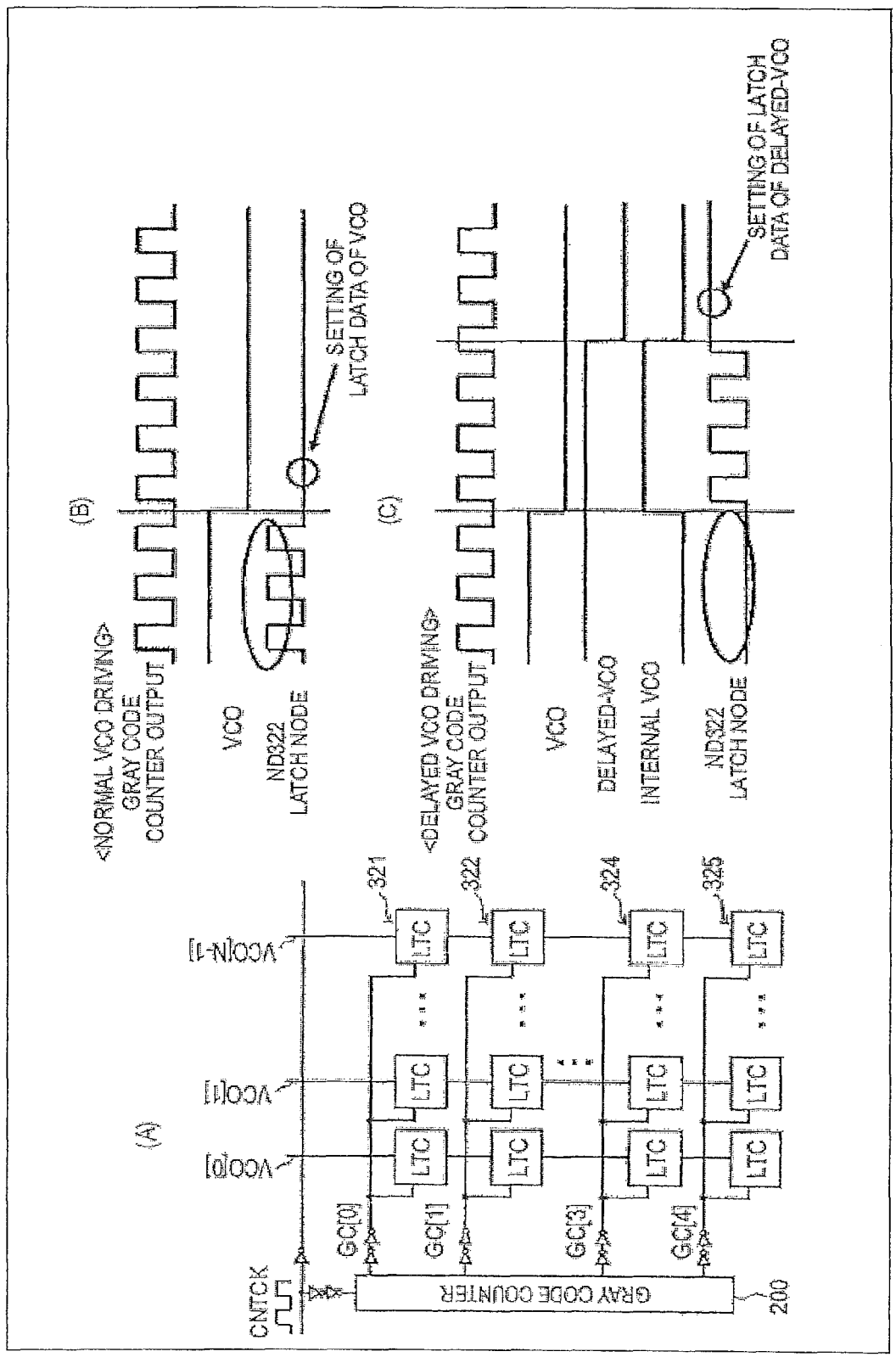
FIG. 10 is a diagram for describing delayed VCO driving which is a preferred driving method for latch processing in a low-level bit latch section according to an embodiment.

FIG. 10 is a circuit diagram illustrating a specific configuration example of a high-level side ripple counter according to the embodiment.

Figure 11:
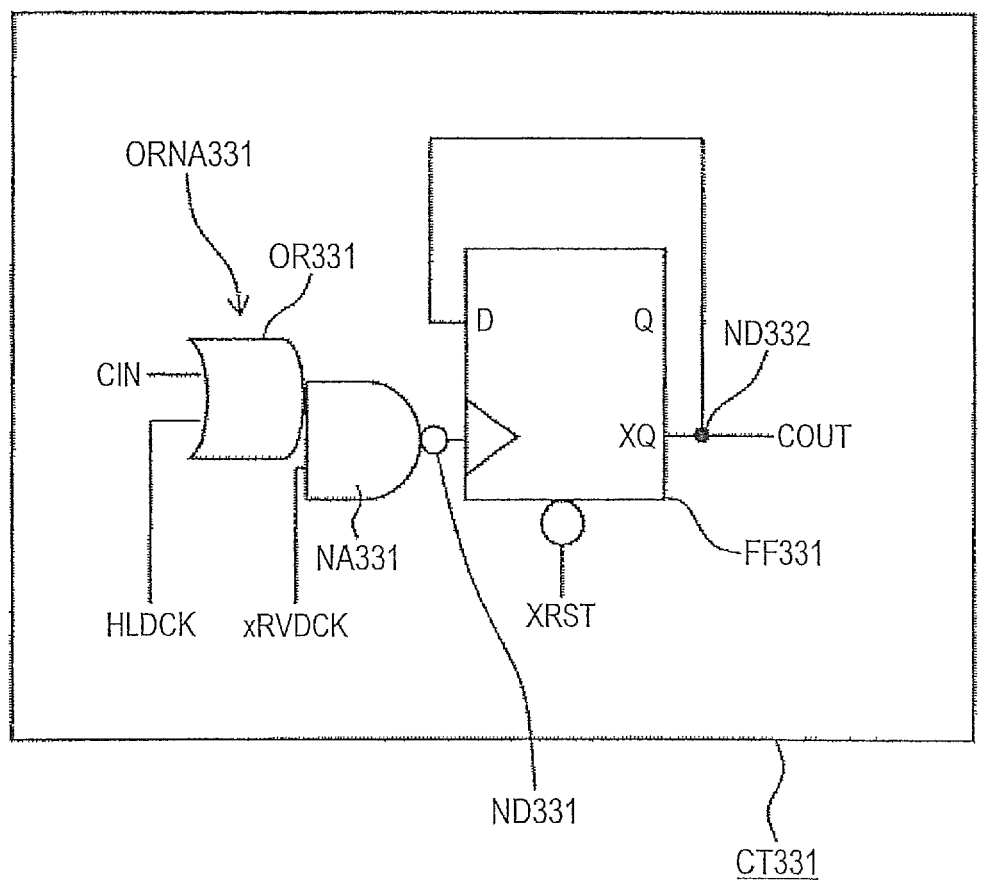
FIG. 11 is a circuit diagram illustrating a specific configuration example of a high-level side ripple counter according to an embodiment.

The high-level side ripple counter of FIG. 11 shows a common circuit configuration of the ripple counters CT331 to CT340.

Here, the ripple counter CT331 will be described as an example.

The ripple counter CT331 is configured by a flip flop FF331 and an ORNAND gate ORNA331 arranged in a clock input stage of the flip flop FF331.

An earlier stage carry out COUT is input in a first input terminal of an OR gate OR331 of the ORNAND gate ORNA331 as carry in CIN (clock input), and a first external control signal HLDCK is supplied to a second input terminal.

An output of the OR gate OR331 is supplied to a first input terminal of a NAND gate NA331, and a second external control signal xRVDCK is supplied to a second input terminal.

An output of the NAND gate NA331 is connected to a clock node ND331 of the flip flop FF331.

In a case when the output node ND331 of the ORNAND gate ORNA331 is a low-level, in the flip flop FF331, latch data of an output node ND332 is supplied to a Q input side.

In a case when the node ND331 is a high level, in the flip flop FF331, latch data of the output node ND332 becomes a reverse level of a Q input side level.

The ripple counter CT331 with such a configuration has a data reversing function when changing between P-phase and D-phase.

Figure 12:
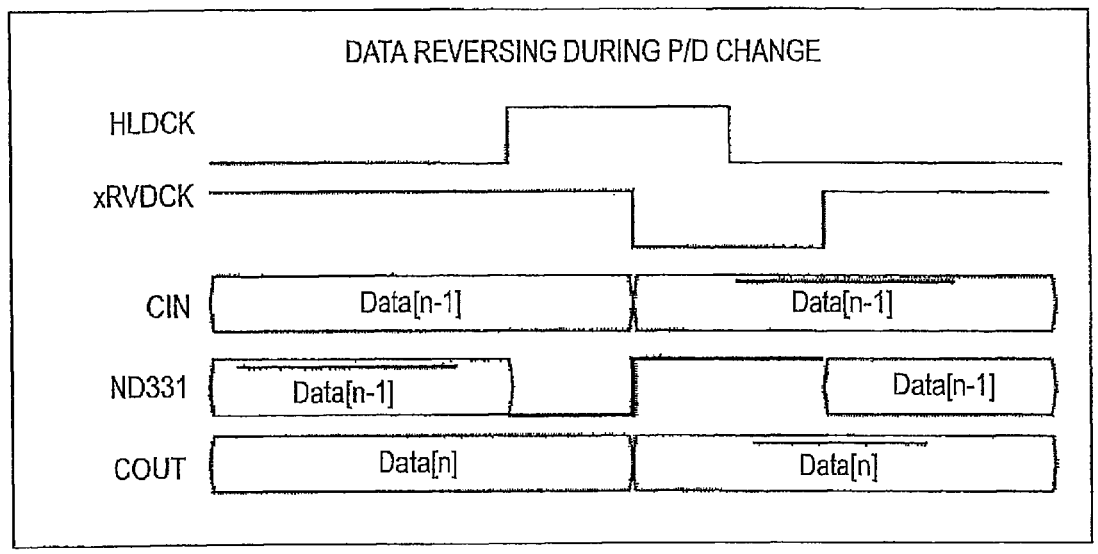
FIG. 12 is a diagram for describing a data reversing function when changing between P-phase and D-phase of the ripple counter of FIG. 11.

FIG. 12 is a diagram for describing the data reversing function when changing between P-phase and D-phase of the ripple counter CT331 of FIG. 11.

Data in P-phase corresponds to first data and data in D-phase corresponds to second data.

The ripple counter CT331 of FIG. 11 directly controls a clock line of each bit from the outside and is capable of realizing data reversal of all bits by a unique one-time enforced addition of a rising (Rise)/falling (Fall) edge which is necessary for the count operation (data reversal).

In the case of this example, in a state where the first external control signal HLDCK is held at a high level, it is possible to change the level of the node ND331 from a low level to a high level by changing the second external control signal xRVDCK from a high level to a low level.

According to this, it is possible to reverse data.

Figure 13:
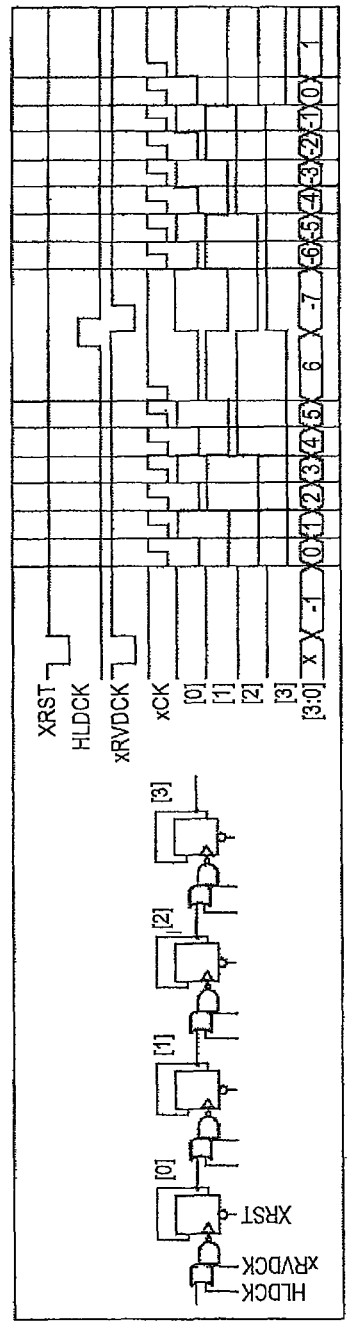
FIG. 13 is a diagram illustrating as an example a timing chart including state transition of output data in a case where four ripple counters are cascade connected.

FIG. 13 is a diagram illustrating as an example a timing chart including state transition of output data in a case where four ripple counters are cascade connected.

In this example, a count up operation is performed, and after the count value becomes "6", in a state where first external control signal HLDCK is held at a high level, data reversal is performed by changing the second external control signal xRVDCK from a high level to a low level.

According to this, it is changed to a down counter from "−7".

In this manner, the high-level bit counter 330 has a function of performing CDS processing of the bit described above in each column.

Accordingly, in each column processing section 300, latched data in the low-level 5 (N) bit Gray codes GC[0] to GC[4] and data with CDS performed by the ripple counter for each column in the high-level 10 (M) bits are output to the data transfer line LTRF.

The data is supplied to the signal processing circuit 180 via the data transfer line LTR and overall CDS is performed.

Figure 14:
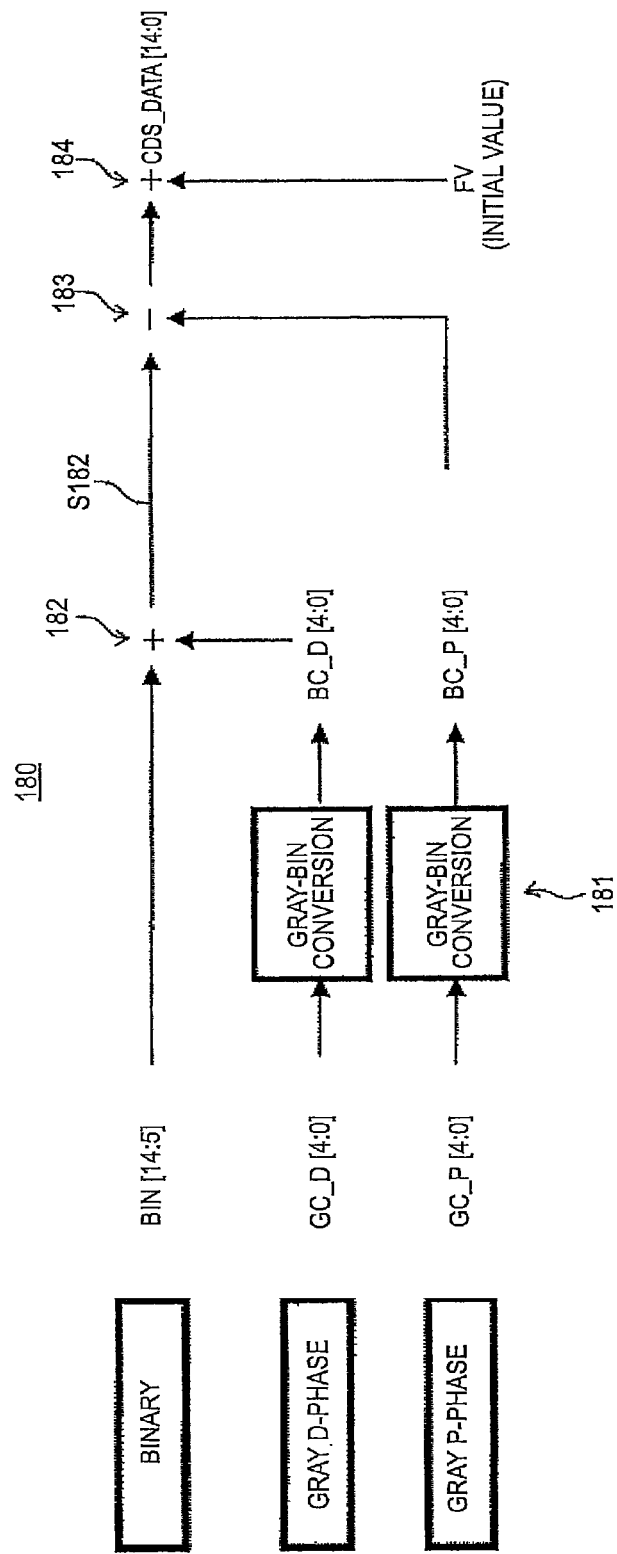
FIG. 14 is a diagram schematically illustrating CDS calculation processing of a later stage signal processing circuit according to an embodiment.

FIG. 14 is a diagram schematically illustrating CDS calculation processing of a later stage signal processing circuit according to the embodiment.

Figure 15:
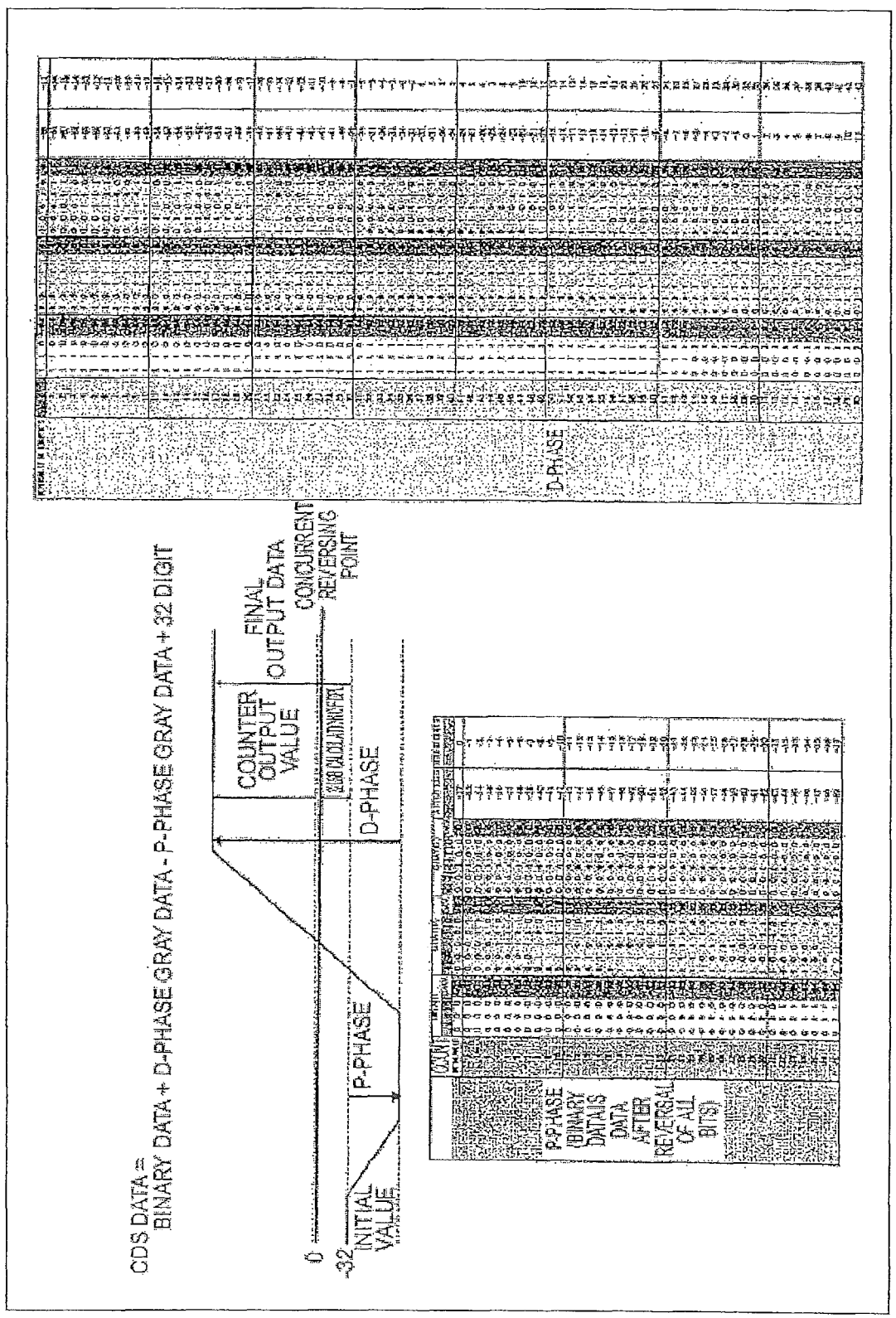
FIG. 15 is a diagram illustrating a specific example of CDS calculation processing of Gray code and binary data according to an embodiment.

FIG. 15 is a diagram illustrating a specific example of CDS calculation processing of Gray code and binary data according to the embodiment.

As basically shown in FIG. 14, the signal processing circuit 180 is input with P-phase Gray code GC_P[4:0], D-phase Gray code GC_D[4:0], and high-level bit BIN [14:5] which is binary data where CDS is performed in advance.

The signal processing circuit 180 has a conversion circuit 181 which converts from Gray code to binary code.

The conversion circuit 181 converts the P-phase Gray code GC_P[4:0] to binary code BC_P[4:0].

The conversion circuit 181 converts the D-phase Gray code GC_D[4:0] to binary code BC_D[4:0].

The signal processing circuit 180 adds the high-level bit BIN [14:5] and the D-phase binary code BC_D[4:0] in an adding section 182.

Then, the signal processing circuit 180 subtracts the P-phase binary code BC_P[4:0] from an adding result S182 of the adding section 182 in an subtracting section 183.

Next, by the signal processing circuit 180 adding an initial value FV (32 in the embodiment) to the subtraction result of the subtracting section in an adding section 184, data CDS_DATA[14:0] where overall CDS calculation has been performed is obtained.

In the example of FIG. 15, a P-phase and D-phase count is performed from an initial reset value −32, and finally, the CDS calculation described above of the low-level Gray code is performed in the signal processing circuit (DPU) 180.

It is possible to express the calculation formula as the following.

CDS data=binary code+*D*-phase Gray data−*P*-phase Gray data+32 digit

That is,

CDS_DATA[14:0]=BIN[14:5]+BC_*D*[4:0]−BC_*P*[4:0]+32

In addition, it is possible to configure so that latch data of the low-level bit latch circuits 321 to 325 perform calculation processing in columns and CDS processing is performed.

Figure 16:
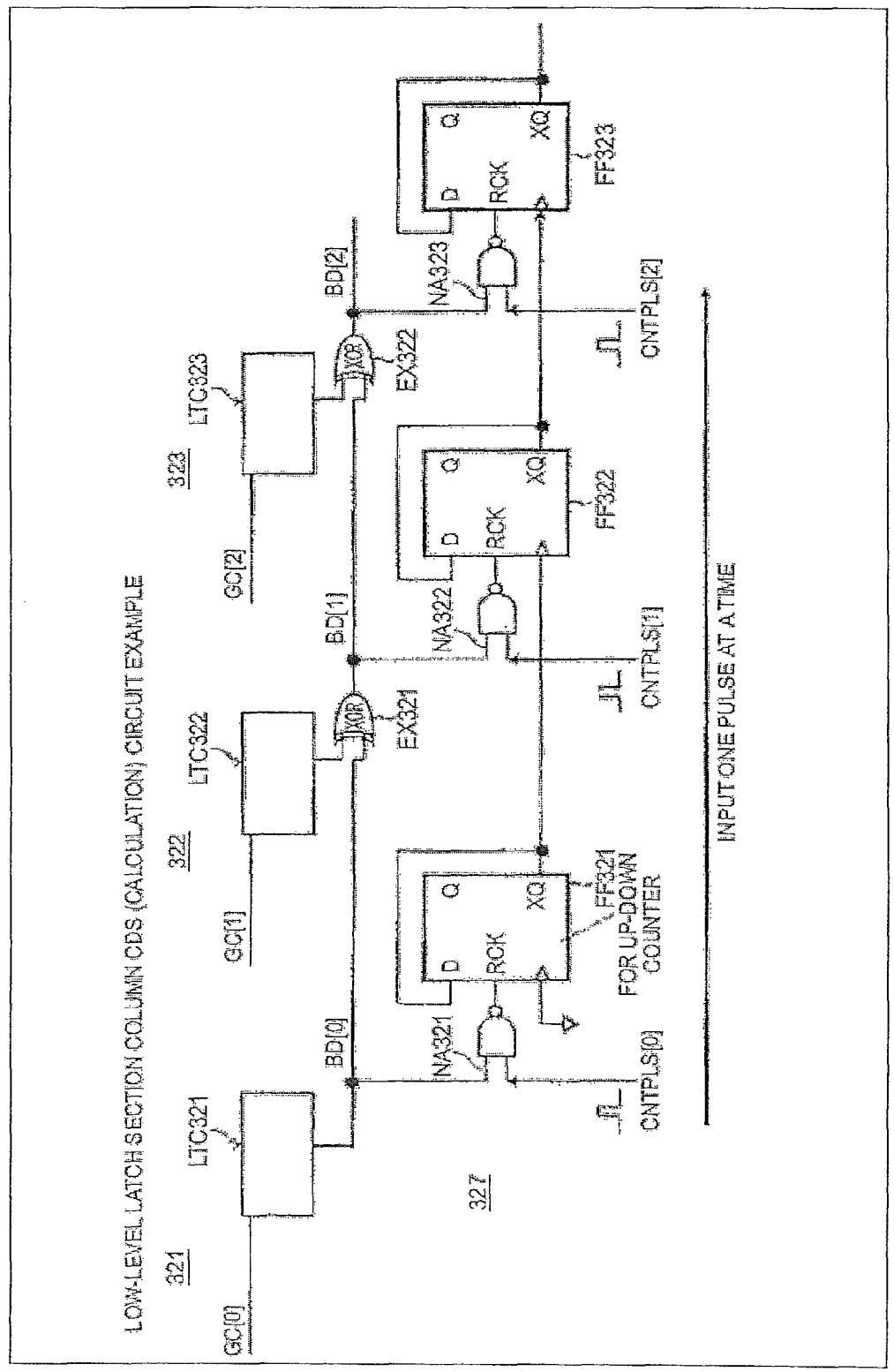
FIG. 16 is a circuit diagram illustrating a configuration example of a CDS processing section which performs calculation processing of latch data of a low-level bit latch circuit in columns and performs CDS processing.

FIG. 16 is a circuit diagram illustrating a configuration example of a CDS processing section which performs calculation processing of latch data of a low-level bit latch circuit in columns and performs CDS processing.

A CDS processing section 327 has flip flops FF321, FF322, FF323 (FF324, FF325) which are up-down counters in addition to code latch sections CLT321 to LT32N (here, until CLT323 is shown).

The CDS processing section 327 has 2 input NAND gates NA321, NA322, NA323 (NA324, NA325) and EXOR gates EX321, EX322 (EX323, EX324) which are code converting circuits.

In the processing section, the Gray code GC[0] latched in the code latch section CLT321 of the lowest-level low-level bit latch circuit 321 is treated as binary code BD[0] as it is.

The lowest-level binary code BD[0] is supplied to the first input terminal of the NAND gate NA321. A pulse signal CNTPLS[0] is supplied to the second input terminal of the NAND gate NA321.

The output terminal of the NAND gate NA321 is connected to a terminal RCK of the flip flop FF321.

In addition, a reverse output terminal XQ of the flip flop FF321 is connected to its own data input terminal D and a clock terminal of the later stage flip flop FF322.

The flip flop FF321 outputs a carry when latch data becomes "1" from "0".

Except for the lowest-level bit, the low-level bits are converted to binary code BD[1] to BD[5] by taking an exclusive (EXOR) of the Gray code GC latched at the same stage and the earlier stage binary code BD.

That is, in regard to the Gray code GC[1] latched in the code latch section CLT322 of the low-level bit latch circuit 322, an EXOR is taken with the earlier stage binary code BD[0] using the EXOR gate EX321 and is converted to binary code BD[1].

The lowest-level binary code BD[1] is supplied to a first input terminal of the NAND gate NA322. A pulse signal CNTPLS[1] is supplied to a second input terminal of the NAND gate NA322.

An output terminal of the NAND gate NA322 is connected to a terminal RCK of the flip flop FF322.

In addition, a reverse output terminal XQ of the flip flop FF322 is connected to its own data input terminal D and a clock terminal of the later stage flip flop FF323.

The flip flop FF322 outputs a carry when latch data becomes "1" from "0".

In regard to the Gray code GC[2] latched in the code latch section CLT323 of the low-level bit latch circuit 323, an EXOR is taken with the earlier stage binary code BD[1] using the EXOR gate EX322 and is converted to binary code BD[2].

The lowest-level binary code BD[2] is supplied to a first input terminal of the NAND gate NA323. A pulse signal CNTPLS[2] is supplied to a second input terminal of the NAND gate NA323.

An output terminal of the NAND gate NA323 is connected to a terminal RCK of the flip flop FF323.

In addition, a reverse output terminal XQ of the flip flop FF322 is connected to its own data input terminal D and a clock terminal of the later stage flip flop FF323.

The flip flop FF323 outputs a carry when latch data becomes "1" from "0".

Below, also in the stages of the low-level bit latch circuits 324 and 325, similar processing is performed.

In addition, the pulse signals CNTPLS[0], [1], [2], [3] and [4] are input in order one pulse at a time.

5. Configuration Example of Bit Inconsistency Prevention Circuit 340

As described previously, in the column processing section 300, the bit inconsistency prevention circuit 340 is arranged which prevents bit inconsistency between output of the low-level bit latch circuit farthest to the high-level side and high-level bit ripple counter circuit farthest to the low-level side of the high-level bit ripple counter 330.

The bit inconsistency prevention circuit 340 is arranged due to the following reason.

In a composite counter method with Gray code and binary code such as in the embodiment, there is a concern that so-called metastability is generated when data is latched at a change point timing of the Gray code highest-level bit GC[4].

When metastability is generated, data inconsistency is generated between the Gray code highest-level bit data (GD) and binary code lowest-level bit data BD[5]. As a result, there is a possibility that erroneous counting will occur.

With regard to this, description will be made in association with FIGS. 17A and 17B.

Figure 17:
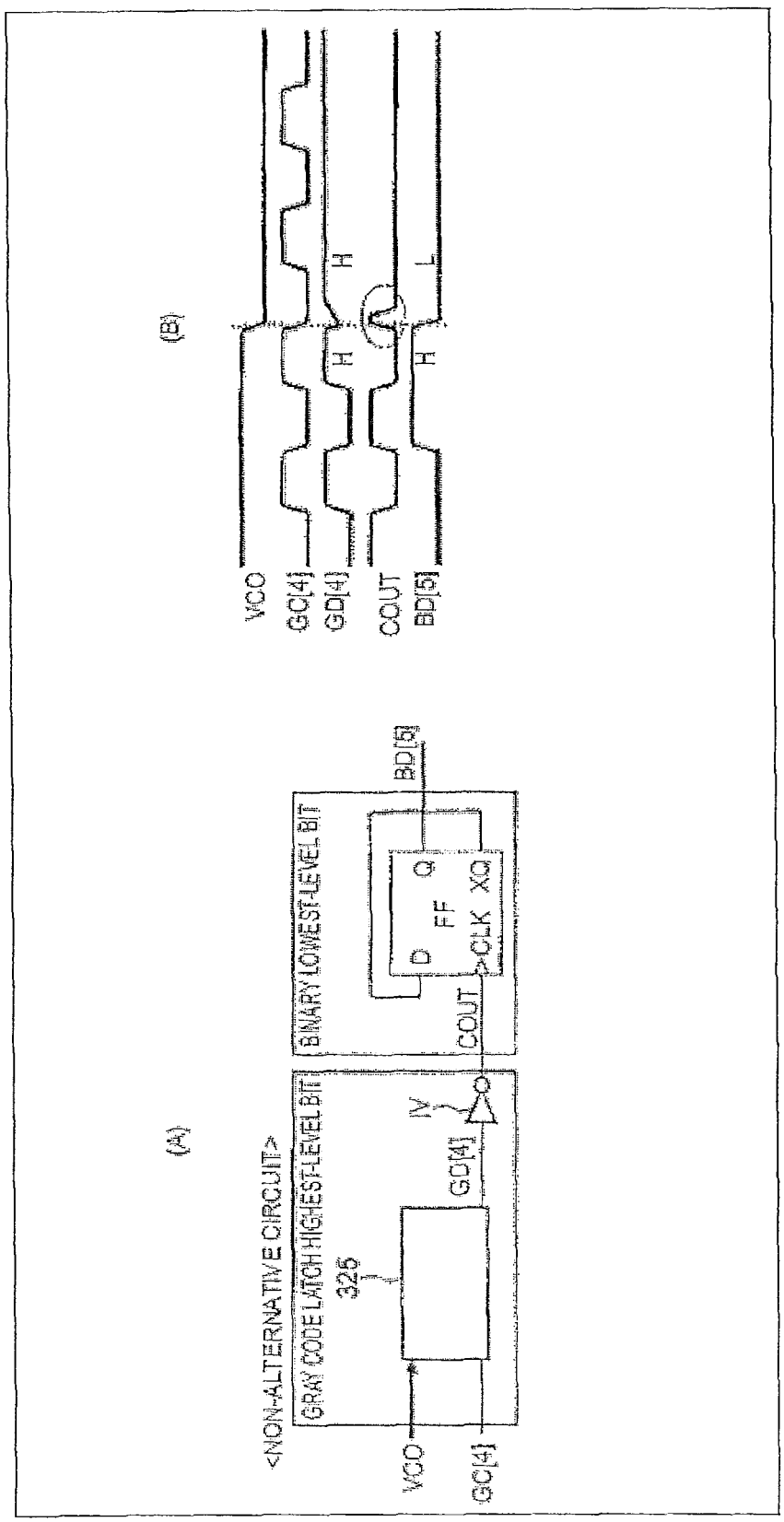
FIG. 17 is a diagram illustrating a timing chart and a configuration in a case when a bit inconsistency prevention circuit is not provided.

FIGS. 17A and 17B are diagrams illustrating a timing chart and a configuration in a case when the bit inconsistency prevention circuit is not provided.

As shown in FIG. 17A, in the case when the bit inconsistency prevention circuit is not provided, when data is latched at a falling edge change point of the Gray code GC[4], metastability is generated depending on the timing.

According to this, it is not possible to obtain consistency between the Gray code data GD[4] and the binary data BD[5] and there is a possibility that data flight of 32 digits will occur.

That is, as shown in FIG. 17B, although there is no falling edge of the Gray code data GD[4], the carry (COUT) is generated, the high-level binary bit BD[5] is reversed, and as a result, data flight occurs.

Figure 18:
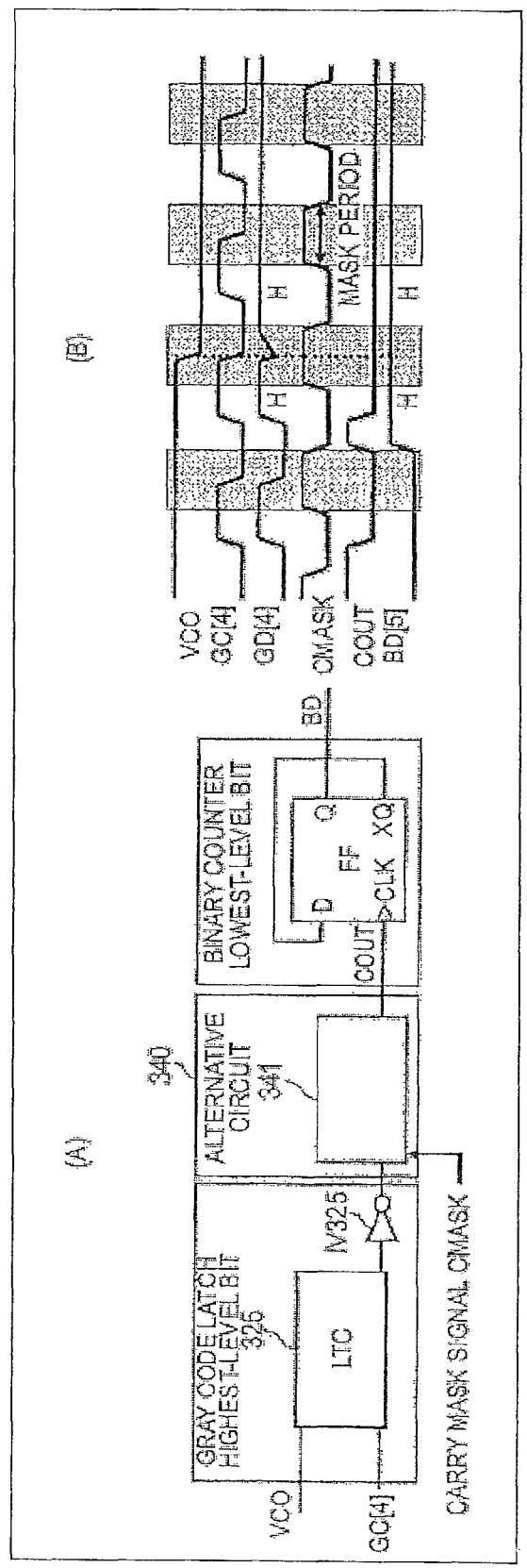
FIG. 18 is a diagram illustrating a timing chart and a configuration in a case when a bit inconsistency prevention circuit is provided.

FIGS. 18A and 18B are diagrams illustrating a timing chart and a configuration in a case when the bit inconsistency prevention circuit is arranged.

In the embodiment, as shown in FIG. 18B, in the bit inconsistency prevention circuit 340, the carry (COUT) generated by the falling edge of the Gray code data GD[4] is temporarily masked using the carry mask signal CMASK.

Then, the carry COUT is output by the value of the Gray code data GD[4] after release of the mask.

In this manner, in the embodiment, by introducing the bit inconsistency prevention circuit 340 and the carry mask signal CMASK, code latch error is prevented.

The bit inconsistency prevention circuit 340 has a bit inconsistency prevention latch circuit 341.

In the latch circuit 341, the carry mask signal CMASK is supplied.

When the carry mask signal CMASK is held at a high level, the latch circuit 341 masks (stops for a predetermined period of time) output of the carry COUT of the corresponding Gray code data GD[4].

Then, the predetermined period of time passes and the carry COUT is output when the carry mask signal CMASK is changed to a low level.

In this manner, after the output of the low-level bit latch circuit 325 which is farthest to the high level side is output stopped for a predetermined period of time through the bit inconsistency prevention circuit 340, it is supplied to the ripple counter CT331, which is farthest to the low level side, of a high-level bit counter section 330 for high-level M bits.

Figure 19:
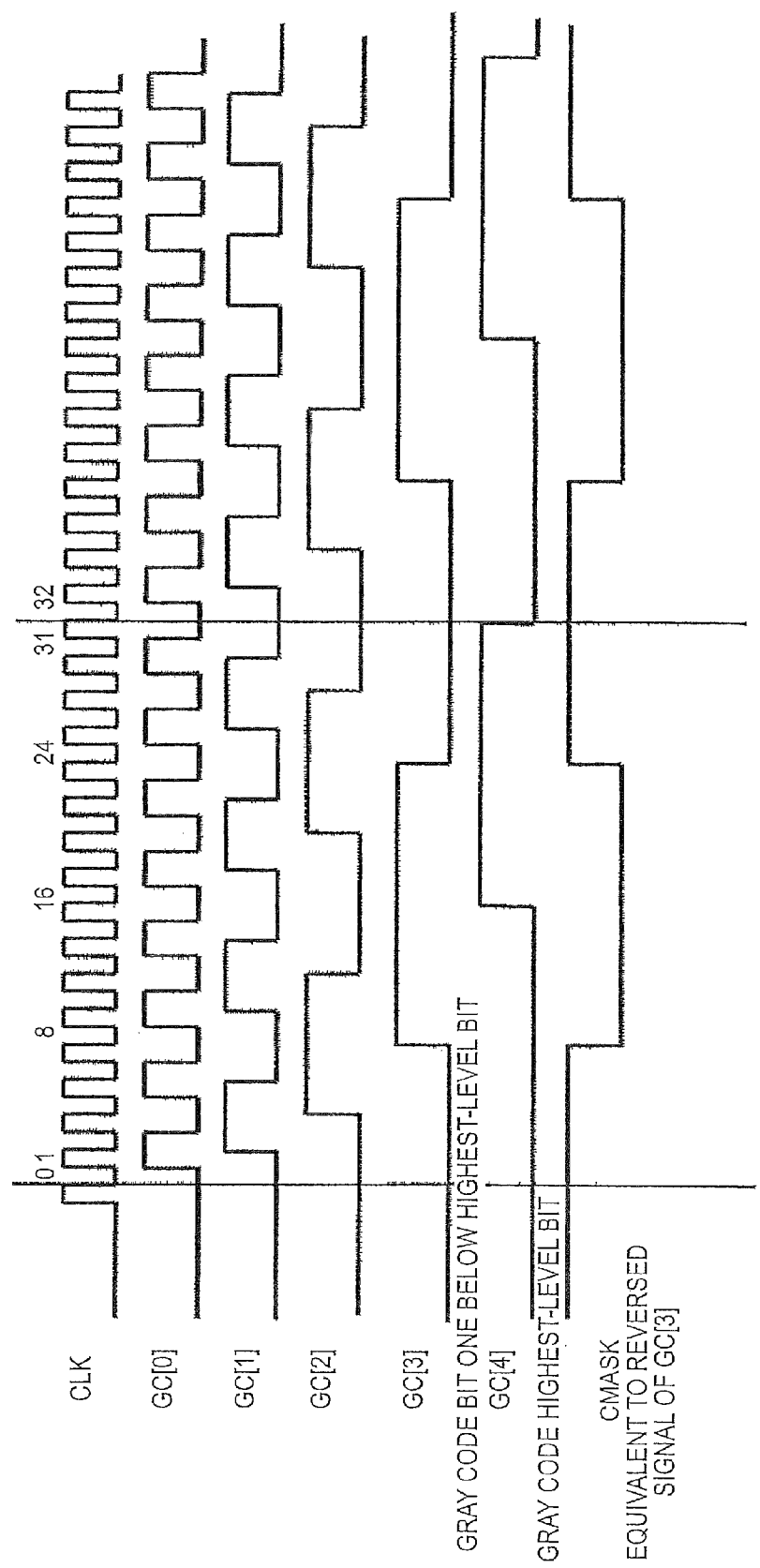
FIG. 19 is a waveform diagram for describing a carry mask signal according to an embodiment.

FIG. 19 is a waveform diagram for describing a carry mask signal according to the embodiment.

It is necessary that the carry mask signal CMASK is a signal which is in a high level at a timing of a falling edge of the Gray code (GC) highest-level bit.

In a case of a Gray code N bit, it is possible to use a reverse signal of the bit which is one below the highest-level bit ($N^{th}$ bit), that is, the N–$1^{th}$ bit, as the carry mask signal CMASK.

This holds for all values of N.

In this example, a signal equivalent to the reverse signal of the Gray code GC[3] is adopted as the carry mask signal CMASK.

Figure 20:
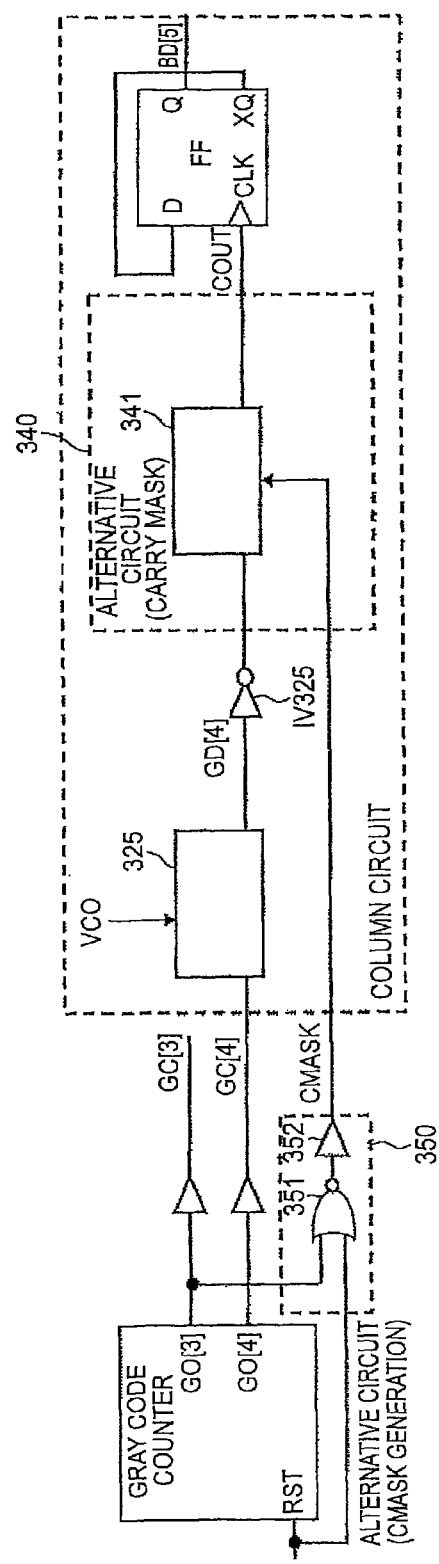
FIG. 20 is a diagram illustrating a configuration example of a column processing section which includes a carry mask signal generating circuit and a bit inconsistency prevention circuit.

FIG. 20 is a diagram illustrating a configuration example of a column processing section which includes a carry mask signal generating circuit and the bit inconsistency prevention circuit 340.

A carry mask signal generating circuit 350 has a NOR gate 351 and a buffer 352.

In the NOR 351, the Gray code GC[3] of the bit which is one below the highest-level bit ($N^{th}$ bit) is supplied to a first input terminal and a reset signal is supplied to a second input terminal.

In this manner, the carry mask signal CMASK is generated as a signal equivalent to the reverse signal of the Gray code GC[3].

In the configuration of FIG. 20, the bit inconsistency prevention circuit 340 has inverters IV342 and 343 which are connected in series to a supply line of the carry mask signal CMASK.

Due to an output of the inverter IV342, a reverse signal XCMASK of the carry mask signal CMASK is obtained, and due to an output of the inverter 1V343, the carry mask signal CMASK with the same phase as the Gray code GC[3] is obtained.

In this manner, in the vicinity of a falling edge of the Gray code GC[4] where there is a possibility of metastability being generated, a later stage carry is masked by the carry mask signal CMASK and a carry is generated by the value of GD[4] when the mask is released.

Also, it is also possible to prevent generation of metastability by data latch timing adjustment without providing the bit inconsistency prevention circuit 340.

Figure 21:
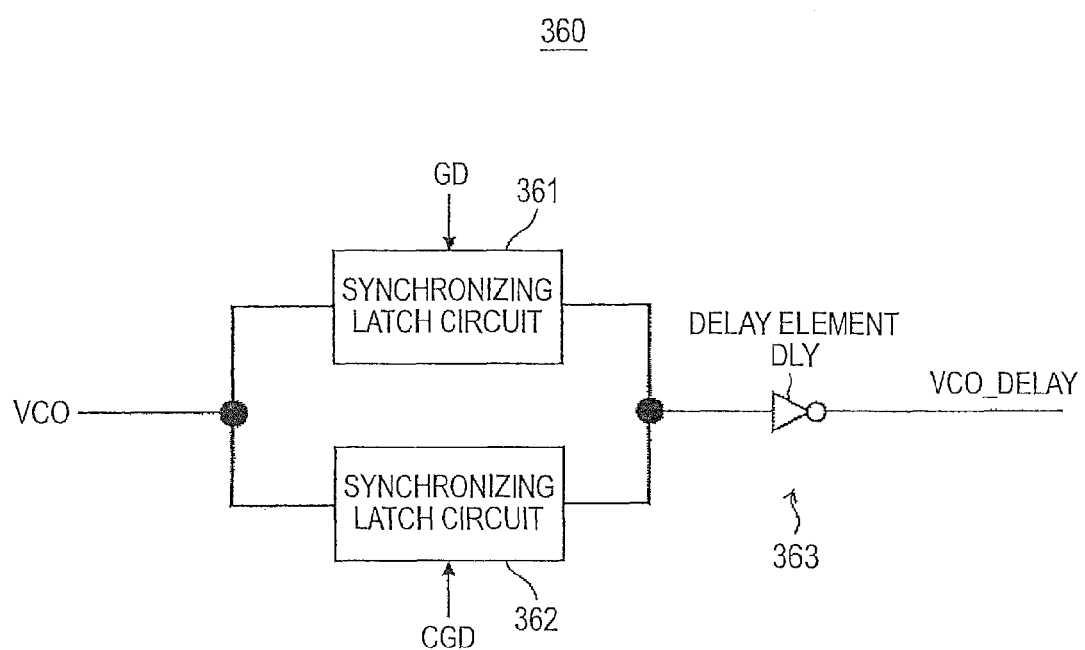
FIG. 21 is a diagram illustrating a configuration example of a data latch timing adjustment circuit.

FIG. 21 is a diagram illustrating a configuration example of a data latch timing adjustment circuit.

Figure 22:
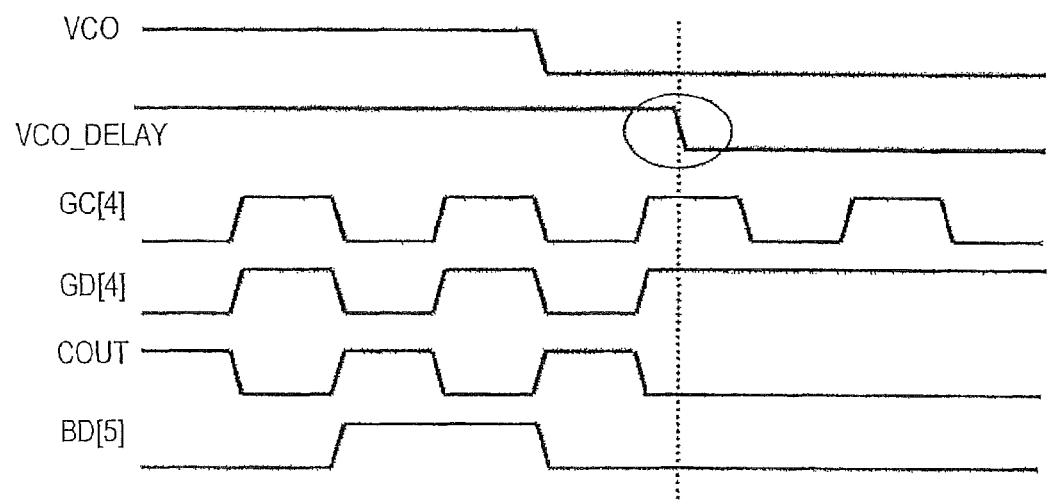
FIG. 22 is a diagram illustrating a timing chart of the circuit of FIG. 21.

FIG. 22 is a diagram illustrating a timing chart of the circuit of FIG. 21.

A data latch timing adjustment circuit 360 is arranged, for example, in the VCO input section 326.

The data latch timing adjustment circuit 360 synchronizes the output signal VCO of the comparator 310, which is used in the latch operation of the low-level bit latch circuit 325 which is farthest to the high level side, with the level of the Gray code data GD, that is, a signal of the latch node ND332 of the low-level bit latch circuit 325.

Also, it has a function of delaying the signal VCO synchronized with the Gray code data GD so that latching is not performed at a timing of the changing of the Gray code GC and supplying it to the low-level bit latch circuit 325.

The data latch timing adjustment circuit 360 has synchronizing latch circuits 361 and 362 and a delay section 363.

The synchronizing latch circuit 361 has a function of latching and outputting the signal VCO in synchronization with the Gray code data signal GD.

The synchronizing latch circuit 362 has a function of latching and outputting the signal VCO in synchronization with a reverse signal CGD of the Gray code data signal GD.

When the synchronizing latch circuit 361 performs the output of the signal VCO, an output of the synchronizing latch circuit 362 is held at high impedance (Hi-Z).

In the same manner, when the synchronizing latch circuit 362 performs the output of the signal VCO, an output of the synchronizing latch circuit 361 is held at high impedance (Hi-Z).

The delay section 363 delays the signal VCO, which is synchronized with the Gray code data signal by synchronizing latch circuits 361 and 362 and delayed, so that latching is not performed at a timing of the changing of the Gray code GC and supplies it to the low-level bit latch circuit 325.

The delay section 363 is formed by one or a plurality of delay elements DLY and adjusts the amount of delay of the signal VCO by the number of elements or a delay value of the delay elements.

In this manner, a synchronized and delayed latch signal (VCO_delay), which is synchronized with the Gray code and given a delay by the data latch timing adjustment circuit 360, is used as a latch signal and it is set so that data latching is not performed at a bit change point timing.

According to this, it is possible to prevent generation of metastability as shown in FIG. 22.

In addition, in the data latch timing adjustment circuit 360, the reason for the synchronizing latch circuits 361 and 362 being provided in parallel is so that the column ADC 150 operates at a clock half cycle resolution.

That is, to maintain the resolution, the synchronizing latch circuits 361 and 362 are provided in parallel so as to synchronize latching so that the timing of the rising edge and the falling edge of the Gray code data is performed in parallel.

The column ADC 150 according to the embodiment is configured in the following manner since most power consumption in a normal column ADC is constituted by low-level side bits of ripple counters in each column.

The column ADC 150 adopts a configuration of latching for each column an output code of the N bit Gray code counter 200, of which one is arranged in a plurality of columns and which performs counting in synchronization with the standard clock PLLCK, without performing the count operation of low-level side bits of each column. According to this, an AD conversion value is set.

In the column ADC 150 of the embodiment, the standard clock PLLCK which is generated by the PLL circuit of the timing control circuit 140 is input only to a number of units of the Gray code counters.

As a result, it is possible to reduce the load on the wirings and increase the operating frequency.

Also, in the column ADC 150 of the embodiment, since the count operation of low-level bits is not performed for each column, it is possible to suppress power consumption to be small.

In the column ADC 150, in regard to the counter high-level side bits, it is possible to perform a ripple count operation using the code (clock) of the counter output $N^{th}$ bit.

According to this, it is possible to perform digital CDS in columns and it is also possible to suppress the area of the horizontal transfer wiring.

Also, it is possible for the column ADC 150 to take a configuration where so-called vertical (V) direction calculation is performed in columns even in regard to latched low-level bits by arranging a calculator and the like in columns.

It is possible for the column ADC 150 of the embodiment to compare with a full bit ripple counter method in a case with simultaneous temporal resolution and to suppress power consumption up to approximately ⅛.

Also, according to the embodiment, it is possible to prevent erroneous counting by the counter which is particular to a composite counter method with Gray code and binary code and which is due to inconsistency of Gray and binary code.

It is possible to apply the solid-state imaging element with such an effect as an imaging device of a digital camera or a video camera.

6. Configuration Example of Camera System

Figure 23:
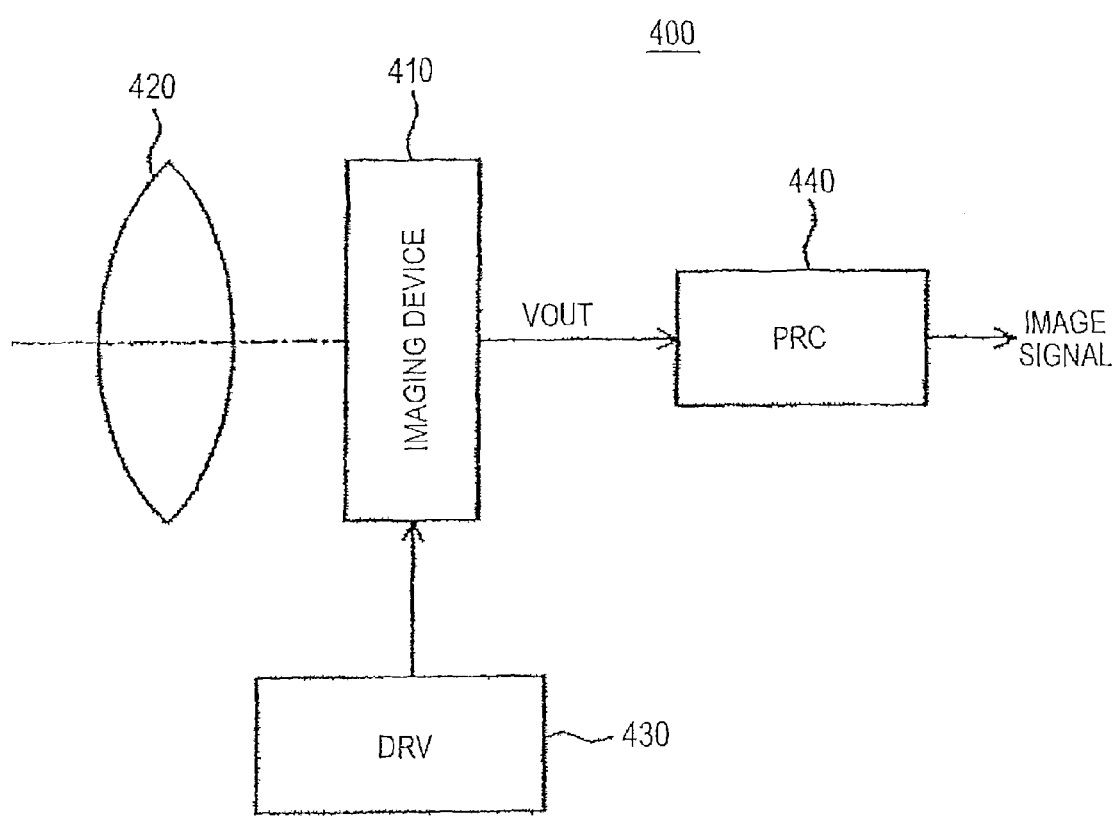
FIG. 23 is a diagram illustrating an example of a configuration of a camera system in which a solid-state imaging element is applied according to an embodiment of the invention.

FIG. 23 is a diagram illustrating an example of a configuration of a camera system in which the solid-state imaging element is applied according to an embodiment of the embodiment.

As shown in FIG. 23, a camera system 400 has an imaging device 410 which is capable of applying the solid-state imaging element 100 according to the embodiment.

The camera system 400 has a lens 420 which images, for example, incident light (image light) on an imaging surface as an optical system guiding incident light (imaging a subject image) to a pixel region of the imaging device 410.

Also, the camera system 400 has a driving circuit (DRV) 430 which drives the imaging device 410 and a signal processing circuit (PRC) 440 which processes an output signal of the imaging device 410.

The driving circuit 430 has a timing generator (not shown) which generates various timing signals including a clock pulse and a start pulse which drives a circuit in the imaging device 410, and drives the imaging device 410 by predetermined timing signals.

Also, the signal processing circuit 440 performs a specific signal processing with regard to the output signal of the imaging device 410.

The image signal processed by the signal processing circuit 440 is recorded in, for example, a recording medium such as a memory. The image information recorded in the recording medium is made into a hard copy by a printer or the like. Also, the image signal processed by the signal processing circuit 440 is displayed as moving images on a monitor formed from a liquid crystal display or the like.

As described above, in an imaging device such as a digital still camera, it is possible to realize a high precision camera by mounting the solid-state imaging element 100 described previously as the imaging device 410.

The invention claimed is:

1. A solid-state imaging device comprising:
   a column processing section including:
      a Gray code counter;
      a low-level bit latching section configured to receive a comparator output from a comparator and a count output from the Gray code counter and to latch a Gray code count value;
      a high-level bit ripple counting section configured to receive a latch output from a low-level bit circuit nearest to a high-level side of the low-level bit latching section and to perform a count operation; and
      a bit inconsistency prevention section configured to prevent bit inconsistency between the low-level bit circuit nearest to the high-level side of the low-level bit latching section and a high-level bit ripple counter circuit nearest to a low-level side of the high-level bit ripple counting section.

2. The solid-state imaging device according to claim 1, wherein
   the Gray code counter is configured to output the count output such that the count output transitions by one bit only.

3. The solid-state imaging device according to claim 1, wherein
   the Gray code counter is configured to output a plurality of Gray code counts, and
   respective ones of the low-level bit latch circuits are configured to receive at least one of the Gray code counts.

4. The solid-state imaging device according to claim 1, wherein
the comparator is configured to compare a reference signal and an analog signal, the analog signal being output from a pixel section.

5. The solid-state imaging device according to claim 4, wherein
the comparator output is high until the reference signal and the analog signal match, and when the reference signal and the analog signal match, the comparator output is low.

6. The solid-state imaging device according to claim 1, wherein
a transition of the comparator output from high to low triggers a latch operation of the count output by the low-level bit latching section.

7. The solid-state imaging device according to claim 1, further comprising
a correlated double sample processing section that performs correlated double processing of latch data of the low-level bit latching section.

8. The solid-state imaging device according to claim 1, wherein
the bit inconsistency prevention section is further configured to temporarily mask a falling edge of the latch output from the low-level bit circuit nearest to the high-level side of the low-level bit latching section, using a carry mask signal.

9. A solid-state imaging device comprising:
a Gray code counter; and
a plurality of column processing sections, respective ones of the column processing sections including a comparator, a low-level bit latching section, a high-level ripple counting section, and a bit inconsistency prevention section, wherein
within a respective column processing section, the low-level bit latching section is configured to receive a comparator output from the comparator and a count output from the Gray code counter and to latch a count Gray code value,
the high-level ripple counting section is configured to receive a latch output from a low-level bit circuit nearest to a high-level side of the low-level bit latching section and to perform a count operation, and
the bit inconsistency prevention section is configured to prevent bit inconsistency between the low-level bit circuit nearest to the high-level side of the low-level bit latching section and a high-level bit ripple counter circuit nearest to a low-level side of the high-level bit ripple counting section.

10. The solid-state imaging device according to claim 9, wherein
the Gray code counter is configured to output the count output such that the count output transitions by one bit only.

11. The solid-state imaging device according to claim 9, wherein
the Gray code counter is configured to output a plurality of Gray code counts, and
respective ones of the low-level bit latch circuits are configured to receive at least one of the Gray code counts.

12. The solid-state imaging device according to claim 9, wherein
the comparator is configured to compare a reference signal and an analog signal, the analog signal being output from a pixel section.

13. The solid-state imaging device according to claim 12, wherein
within the respective column processing section, the comparator output is high until the reference signal and the analog signal match, and when the reference signal and the analog signal match, the comparator output is low.

14. The solid-state imaging device according to claim 9, wherein
within the respective column processing section, a transition of the comparator output from high to low triggers a latch operation of the count output by the low-level bit latching section.

15. The solid-state imaging device according to claim 9, wherein
the respective column processing section further includes a correlated double sample processing section, and
within the respective column processing section, the correlated double sample processing section performs correlated double processing of latch data of the low-level bit latching section.

16. The solid-state imaging device according to claim 9, wherein
the bit inconsistency prevention section is further configured to temporarily mask a falling edge of the latch output from the low-level bit circuit nearest to the high-level side of the low-level bit latching section, using a carry mask signal.

17. An analog-digital conversion method comprising:
outputting a comparator output to a low-level bit latching section;
outputting a Gray code count output to the low-level bit latching section;
latching a Gray code count value with the low-level bit latching section;
receiving a latch output from a low-level bit circuit nearest to a high-level side of the low-level bit latching section with a high-level bit ripple counting section;
performing a count operation with the high-level bit ripple counting section; and
preventing bit inconsistency between the low-level bit circuit nearest to the high-level side of the low-level bit latching section and a high-level bit ripple counter circuit nearest to a low-level side of the high-level bit ripple counting section, with a bit inconsistency prevention section.

18. The analog-digital conversion method according to claim 17, wherein
in outputting the Gray code count output, the Gray code count output transitions by one bit only.

19. The analog-digital conversion method according to claim 17, wherein
outputting the Gray code count output to the low-level bit latching section includes outputting a plurality of Gray code counts to the low-level bit latching section, and
respective ones of the low-level bit latch circuits receive at least one of the Gray code counts.

20. The analog-digital conversion method according to claim 17, further comprising:
comparing a reference signal and an analog signal, the analog signal being output from a pixel section.

21. The analog-digital conversion method according to claim 20, further comprising:
outputting a high level to the low-level bit latching section until the reference signal and the analog signal match, and when the reference signal and the analog signal match, outputting a low level to the low-level bit latching section.

22. The analog-digital conversion method according to claim 17, further comprising:
triggering, with a transition of the comparator output from high to low, a latch operation of a Gray code counter that outputs the Gray code count output by the low-level bit latching section.

23. The analog-digital conversion method according to claim 17, further comprising:
performing correlated double sample processing of latch data of the low-level bit latching section.

24. The analog-digital conversion method according to claim 17, further comprising:
temporarily masking a falling edge of the latch output from the low-level bit circuit nearest to the high-level side of the low-level bit latching section using a carry mask signal, with the bit inconsistency prevention section.

25. A analog-digital conversion method comprising:
outputting comparator outputs to a plurality of low-level bit latching sections;
outputting a Gray code count output to respective ones of the low-level bit latching sections;
latching Gray code count values with respective ones of the low-level bit latching sections;
receiving a latch output from low-level bit circuits nearest to a high-level side of respective ones of the low-level bit latching sections with a corresponding plurality of high-level bit ripple counting sections;
performing a count operation with respective ones of the high-level bit ripple counting sections; and
preventing bit inconsistency between the low-level bit circuit nearest to the high-level side of respective ones of the low-level bit latching section and a high-level bit ripple counter circuit nearest to a low-level side of corresponding ones of the high-level bit ripple counting section, with a plurality of bit inconsistency prevention sections.

26. The solid-state imaging device according to claim 25, wherein
in outputting the Gray code count output, the Gray code count output transitions by one bit only.

27. The analog-digital conversion method according to claim 25, wherein
outputting the Gray code count output to respective ones of the low-level bit latching sections includes outputting a plurality of Gray code counts to respective ones of the low-level bit latching sections, and
respective ones of the low-level bit latch circuits included in respective ones of the low-level bit latching sections receive at least one of the Gray code counts.

28. The analog-digital conversion method according to claim 25, further comprising:
comparing, for respective ones of the low-level bit latching sections, a reference signal and a corresponding analog signal, the corresponding analog signal being output from a corresponding pixel section.

29. The analog-digital conversion method according to claim 28, further comprising:
outputting to respective ones of the low-level bit latching sections a high level until the reference signal and the corresponding analog signal match, and
outputting to respective ones of the low-level bit latching sections a low level when the reference signal and the corresponding analog signal match.

30. The analog-digital conversion method according to claim 25, further comprising:
triggering, with a transition of comparator outputs, a latch operation of a Gray code counter that outputs the Gray code count output by corresponding ones of the low-level bit latching sections.

31. The analog-digital conversion method according to claim 25, further comprising:
performing correlated double sample processing of latch data of respective ones of the low-level bit latching sections.

32. The analog-digital conversion method according to claim 25, further comprising:
temporarily masking a falling edge of the latch output from the low-level bit circuit nearest to the high-level side of respective ones of the low-level bit latching section using a carry mask signal, with the respective ones of the bit inconsistency prevention sections.

* * * * *